US012457691B2

(12) United States Patent
Savage et al.

(10) Patent No.: US 12,457,691 B2
(45) Date of Patent: Oct. 28, 2025

(54) TECHNIQUES TO CONTROL CORROSION FOR ELECTRONIC DEVICES THROUGH USE OF A CORROSION INHIBITOR SUBSTANCE

(71) Applicant: Cisco Technology, Inc., San Jose, CA (US)

(72) Inventors: Mary Kathryn Savage, Hoover, AL (US); Weijie Lin, Milpitas, CA (US); Fernando Lozano, East Palo Alto, CA (US); Jerrold M. Pianin, Peoria, AZ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 1282 days.

(21) Appl. No.: 17/186,637

(22) Filed: Feb. 26, 2021

(65) Prior Publication Data
US 2022/0279660 A1    Sep. 1, 2022

(51) Int. Cl.
  *H05K 3/28*   (2006.01)
  *H05K 1/02*   (2006.01)
  *H05K 7/20*   (2006.01)
(52) U.S. Cl.
  CPC .......... *H05K 3/282* (2013.01); *H05K 1/0203* (2013.01); *H05K 7/20145* (2013.01); *H05K 7/2039* (2013.01); *H05K 2201/066* (2013.01)
(58) Field of Classification Search
  CPC ................. H05K 3/282; H05K 1/0203; H05K 7/20145; H05K 7/2039; H05K 7/20136;
(Continued)

(56) References Cited

U.S. PATENT DOCUMENTS 5,115,975 A  *  5/1992  Shilling ................... A61L 9/03
                                                239/57
9,656,201 B2    5/2017  Gencer et al.
(Continued)

FOREIGN PATENT DOCUMENTS

CN          104630773 A       5/2015

OTHER PUBLICATIONS

Seckin Ozol, "Are VCIs Dangerous?", Transhield, Inc., May 5, 2020, 12 pages.
(Continued)

*Primary Examiner* — Timothy C Cleveland
(74) *Attorney, Agent, or Firm* — Edell, Shapiro & Finnan, LLC

(57) ABSTRACT

Presented herein is a corrosion inhibitor dispensing system that provides for the in-situ application of a corrosion inhibitor in order to protect internal elements of an apparatus from corrosion. In one example, an apparatus is provided that may include a housing to contain one or more electronic components. The housing includes air inflow ports configured to limit internal air from exiting the housing during a corrosion inhibitor dispensing processes, air outflow ports configured to limit external air from entering the housing during the dispensing process, and one or more fans to direct airflow for the housing. The apparatus further includes a corrosion inhibitor dispensing system that includes a dispensing container to hold a corrosion inhibitor in a non-vaporized state and includes one or more ports for dispensing the corrosion inhibitor in a vaporized state during the corrosion inhibitor dispensing processes. A controller is provided to manage the dispensing process.

20 Claims, 11 Drawing Sheets

(58) Field of Classification Search
CPC .......... H05K 7/20727; H05K 2201/066; B05B 1/005; B05B 1/32
See application file for complete search history.

(56) References Cited

U.S. PATENT DOCUMENTS

| | | |
|---|---|---|
| 2007/0138031 A1 | 6/2007 | Miksic et al. |
| 2016/0184759 A1 | 6/2016 | Gencer et al. |
| 2020/0024752 A1 | 1/2020 | Lee et al. |
| 2020/0332422 A1 | 10/2020 | Taylor et al. |
| 2020/0355600 A1 | 11/2020 | Goergen et al. |

OTHER PUBLICATIONS

Mallory McGuiness, "Corrosion: What is Water Damage Really Doing to Your Electronics?", HZO, Oct. 15, 2020, 8 pages.

Zerust Excor, "Vapor Corrosion Inhibitor Technology", 5 pages, retrieved from Internet Nov. 14, 2020; https://www.zerust.com/vapor-corrosion-inhibitor/.

Daubert Cromwell, "Environmentally Friendly VCI Products", 6 pages, retrieved from Internet Nov. 10, 2020; https://daubertcromwell.com/environmental-friendly/.

The Rust Store, "Cortec VpCI-101 Emitter (50/carton)", 4 pages, retrieved from Internet Nov. 10, 2020; https://www.theruststore.com/...0.aspx?locale=en-S&gclid=EAIalQobChMI9fGakcPG7AIVxuDICh0T0QUAEAQYAiABEgKNzfD_BwE.

Mer-Mar Electronics, "Conformal Coating—Protect your PCBs from adverse environment conditions", Jul. 23, 2019, 6 pages.

\* cited by examiner

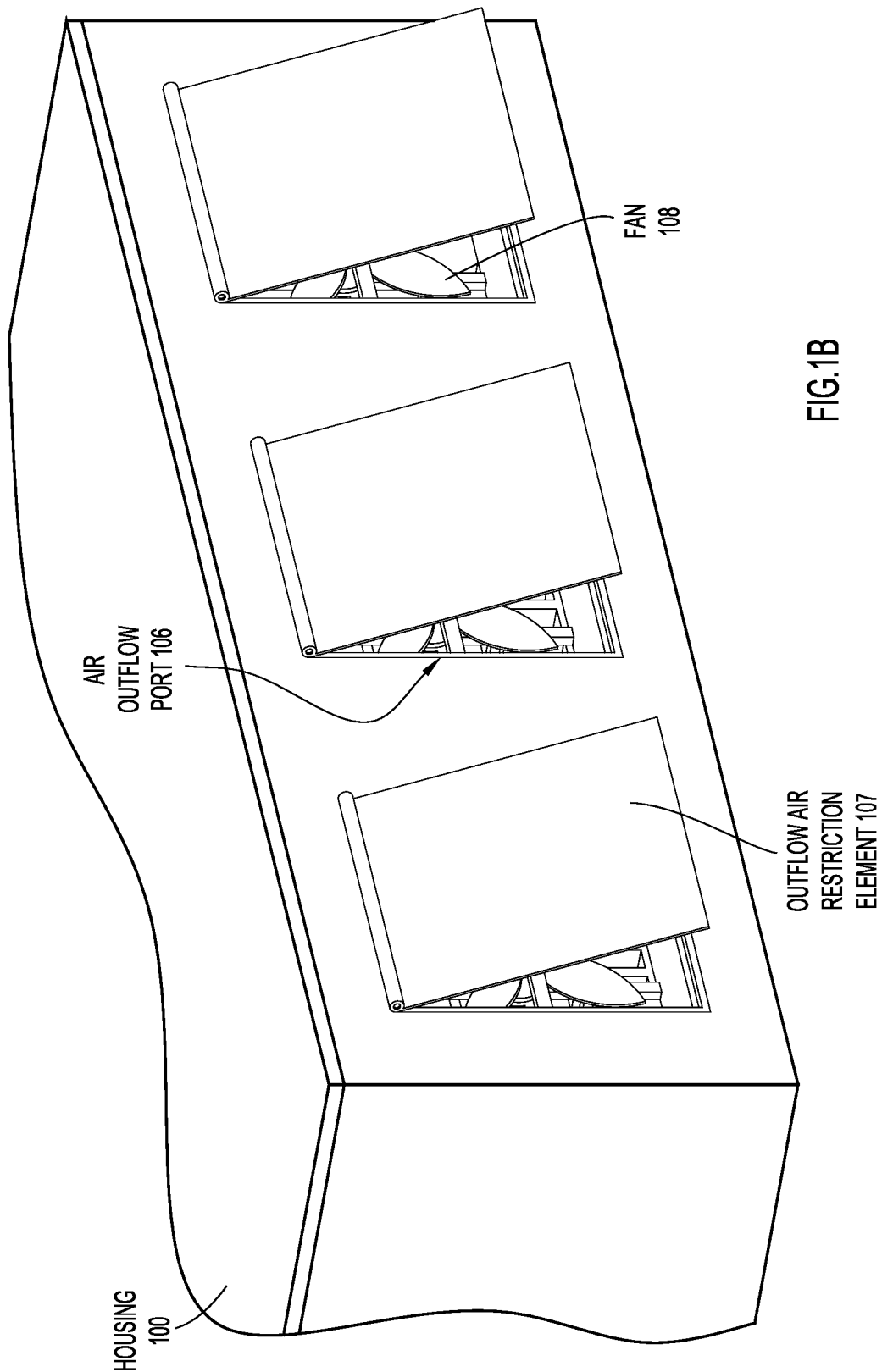

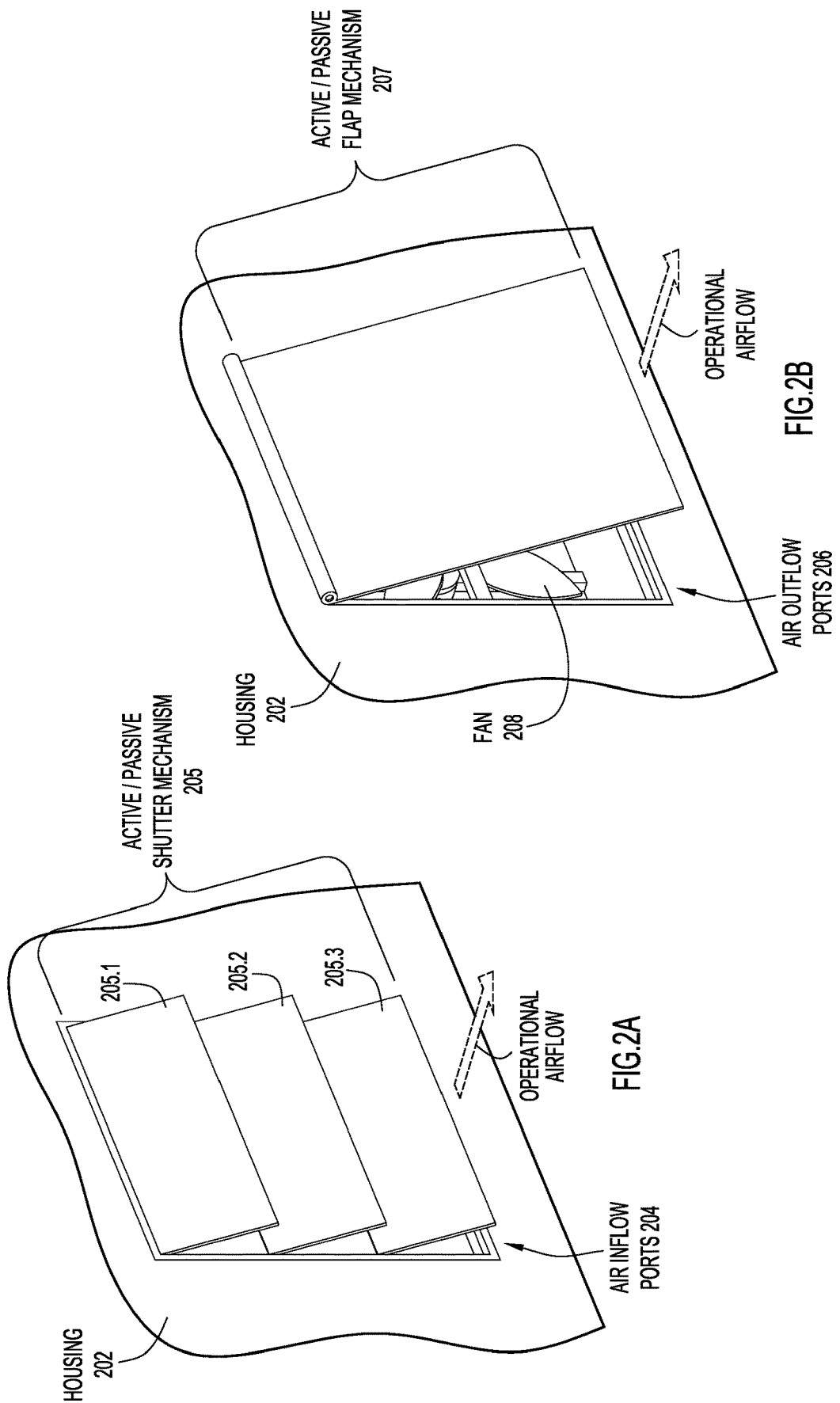

TECHNIQUES TO CONTROL CORROSION FOR ELECTRONIC DEVICES THROUGH USE OF A CORROSION INHIBITOR SUBSTANCE

TECHNICAL FIELD

The present disclosure relates to network equipment.

BACKGROUND

Many air-cooled products that are exposed to humid environments include a printed circuit board (PCB) conformal coating that prevents PCB corrosion. Although a conformal coating prevents corrosion, it is hazardous to work with and often renders PCBs difficult to rework. Accordingly, there are significant challenges in preventing corrosion of internal components of electronic devices.

BRIEF DESCRIPTION OF THE DRAWINGS

FIGS. 1A, 1B, and 1C are diagrammatic representations of an electronic apparatus that includes a corrosion inhibitor dispensing system that can be utilized to prevent corrosion of internal electronic components of the electronic apparatus, according to an example embodiment.

FIGS. 2A, 2B, 2C, and 2D are diagrammatic representations depicting different example air and/or vapor restriction element configurations that may be utilized for an electronic apparatus that includes a corrosion inhibitor dispensing system, according to various example embodiments.

DESCRIPTION OF EXAMPLE EMBODIMENTS

Overview

Figure 1A:
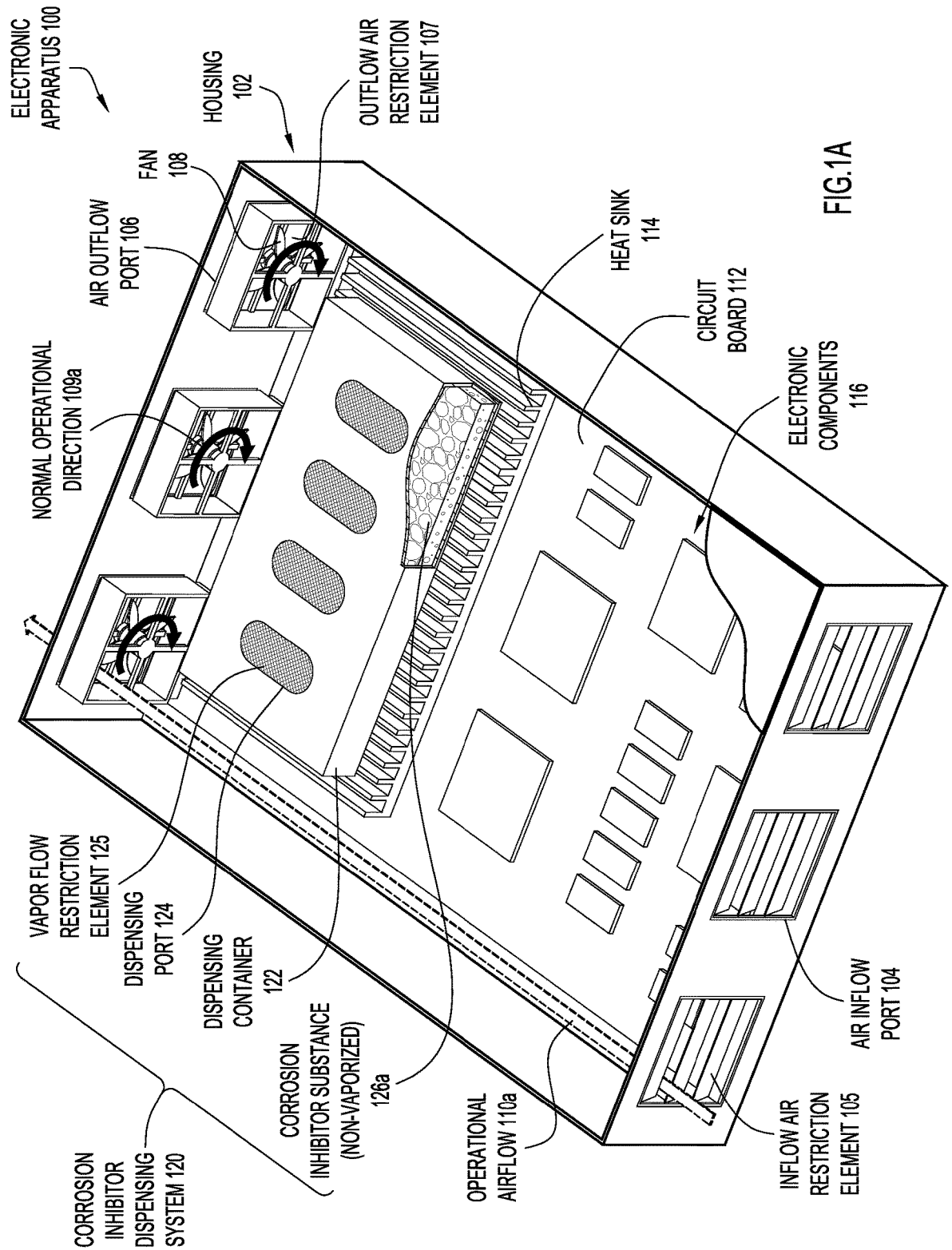

Presented herein is a corrosion inhibitor dispensing system that provides for the in-situ application of a corrosion inhibitor, such as a volatile corrosion inhibitor (VCI), also sometimes referred to as a vapor corrosion inhibitor, for an electronic apparatus in order to protect internal elements of the apparatus from corrosion.

In at least one embodiment, an electronic apparatus is provided that may include a housing configured to contain one or more electronic components; one or more air inflow ports for the housing, wherein the one or more air inflow ports are configured to limit internal air within the housing from exiting the housing during one or more corrosion inhibitor dispensing processes; one or more air outflow ports for the housing, wherein the one or more air outflow ports are configured to limit external air from entering the housing during the one or more corrosion inhibitor dispensing processes; one or more fans configured for the one or more air outflow ports to direct airflow for the housing; and a corrosion inhibitor dispensing system, the corrosion inhibitor dispensing system comprising: a dispensing container to hold a corrosion inhibitor substance in a non-vaporized state, wherein the dispensing container comprises one or more ports for dispensing the corrosion inhibitor substance in a vaporized state during the one or more corrosion inhibitor dispensing processes; and a controller to manage the one or more corrosion inhibitor dispensing processes.

In at least one embodiment, a corrosion inhibitor dispensing system for a housing that is to contain one or more electronic components is provided that may include a dispensing container to hold a corrosion inhibitor substance in a non-vaporized state, wherein the dispensing container comprises one or more ports for dispensing the corrosion inhibitor substance in a vaporized state; and a controller to manage one or more corrosion inhibitor dispensing processes, wherein the one or more corrosion inhibitor dispensing processes include causing the corrosion inhibitor substance in the vaporized state to circulate within the housing for a period of time by changing an operational airflow of the housing to a recirculating airflow utilizing, at least in part, one or more fans of the housing.

In at least one embodiment, a method is provided that may include determining that a corrosion inhibitor substance is to be dispensed into a housing that contains one or more electronic components; causing the corrosion inhibitor substance to be heated to a vaporized state; and causing the corrosion inhibitor substance in the vaporized state to circulate within the housing for a period of time by changing an operational airflow of the housing to a recirculating airflow utilizing, at least in part, one or more fans for the housing.

EXAMPLE EMBODIMENTS

Example embodiments that may be used to implement the features and functionality of this disclosure will now be described with more particular reference to the accompanying figures. When used to describe a range of dimensions and/or other characteristics (e.g., time, distance, length, etc.) of an element, operations, conditions, etc. the phrase 'between X and Y' represents a range that includes X and Y. Similarly, when used herein, the term 'approximately' and terms of its family (such as 'approximate', etc.) should be understood as indicating values very near to those that accompany the aforementioned term. That is to say, a deviation within reasonable limits from an exact value should be accepted because a skilled person in the art will understand that such a deviation from the values indicated is inevitable due to measurement inaccuracies, etc. The same applies to the terms 'about', 'around', 'substantially', and/or variations thereof. Further, each example embodiment is described herein as illustrative and is not to be construed as a preferred or advantageous embodiment, but rather as one example or illustration of a possible embodiment.

For example, embodiments discussed herein, reference may be made to the spatial relationships between various components and to the spatial orientation of various aspects of components as depicted in the attached drawings. However, as will be recognized by those skilled in the art, the devices, components, members, apparatuses, etc. described herein may be positioned in any desired orientation. Thus, the use of terms such as 'above', 'below', 'upper', 'lower', 'top', 'bottom', and/or any other similar terms that can be used to describe spatial relationships between various components or to describe the spatial orientation of aspects of such components, should be understood to describe a relative relationship between the components or a spatial orientation of aspects of such components, respectively, as the components described herein may be oriented in any desired direction.

Air-cooled electronic devices pull air from the potentially harmful outside environment to cool internal electronic components. Many air-cooled electronic devices, such as network routers, switches, gateways, etc. that are exposed to humid environments typically include a conformal coating, such as a polymeric film or the like, that is applied to printed circuit boards (PCBs) of the devices to prevent corrosion of the PCB, electronic interconnects, electronic components, etc. Although conformal coatings may prevent corrosion, such coatings are hazardous to work with and often render boards difficult to rework (e.g., to change components, etc.).

Accordingly, presented herein is a self-contained corrosion inhibitor dispensing system that provides for the in-situ application of a corrosion inhibitor, such as a volatile corrosion inhibitor (VCI), also sometimes referred to as a vapor corrosion inhibitor, for an electronic apparatus as an alternative to conformal coating. By 'in-situ', it is meant that the corrosion inhibitor dispensing system may provide for the ability to dispense a corrosion inhibitor within a housing of an electronic apparatus as the electronic apparatus is operating normally.

Figure 1C:
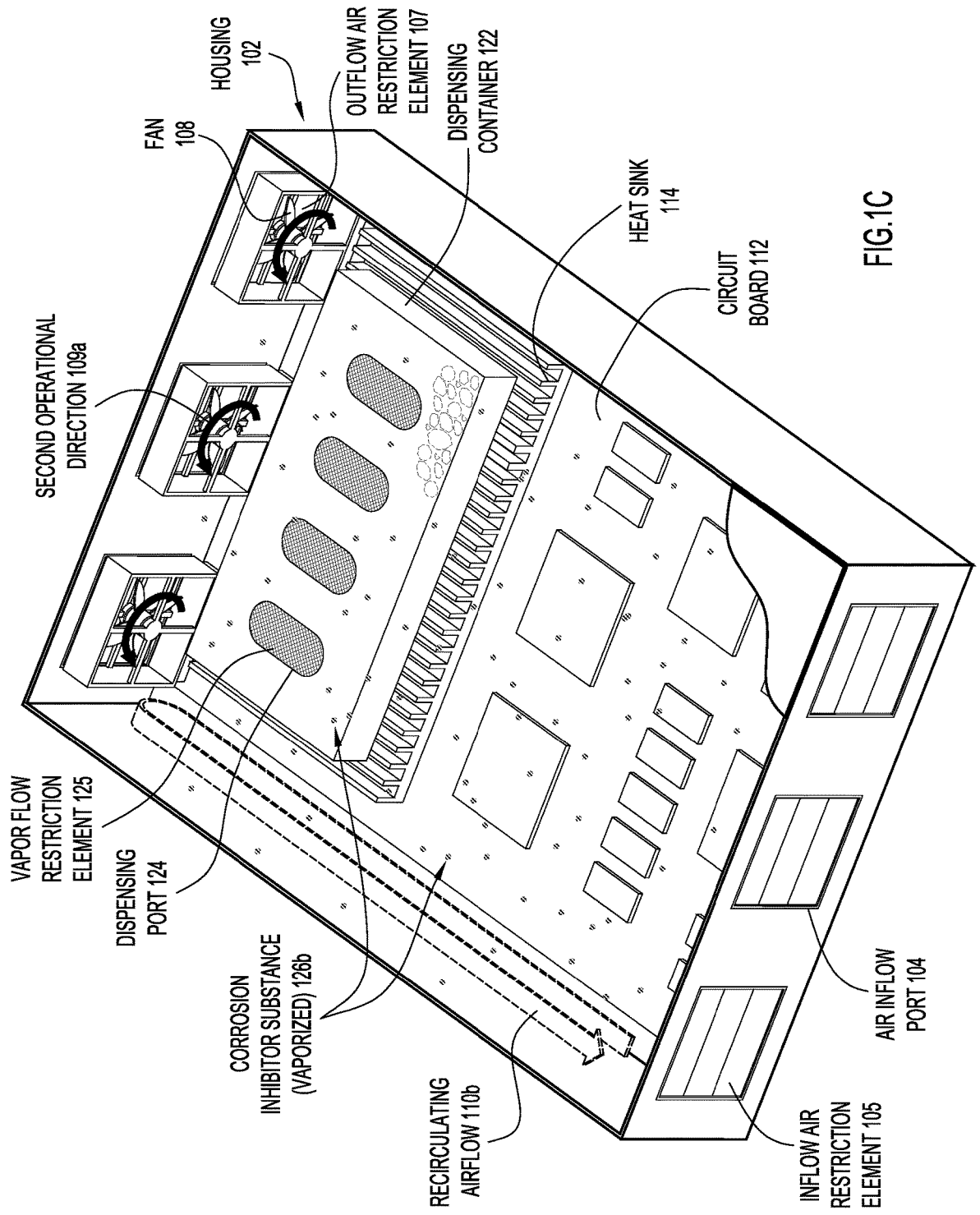
Figure 1D:
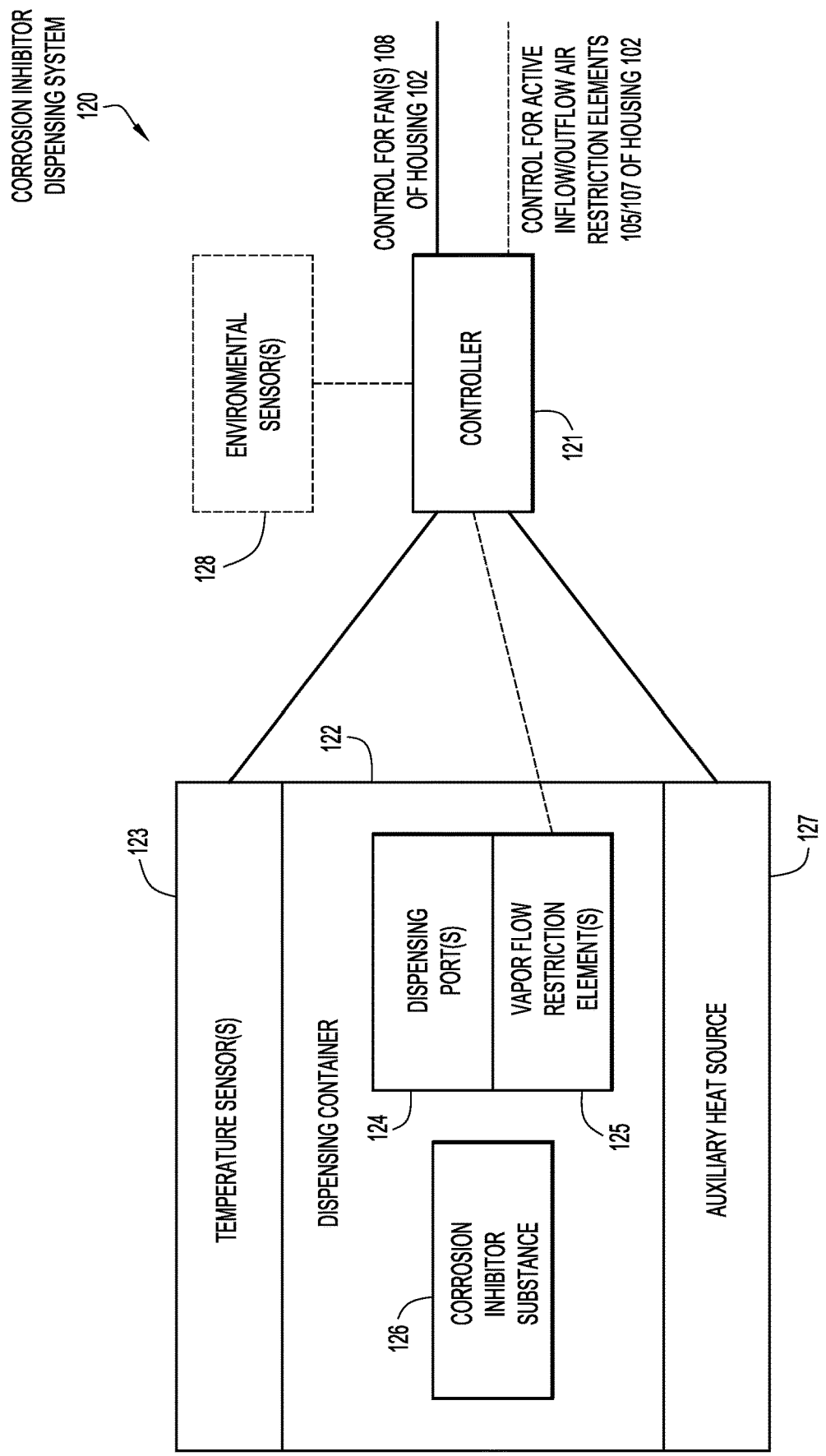
FIG. 1D is a block diagram illustrating example details associated with the corrosion inhibitor dispensing system of FIGS. 1A, 1B, and 1C, according to an example embodiment.

Referring to FIGS. 1A, 1B, and 1C, FIGS. 1A, 1B, and 1C are diagrammatic representations of an electronic apparatus 100 that includes a corrosion inhibitor dispensing system 120 that can be utilized to prevent corrosion of internal electronic components of the electronic apparatus, according to an example embodiment. FIG. 1D is a block diagram illustrating example details associated with the corrosion inhibitor dispensing system 120 of FIGS. 1A, 1B, and 1C, according to an example embodiment. Example details of the corrosion inhibitor dispensing system 120 of FIG. 1D are discussed with reference to FIGS. 1A, 1B, and 1C.

As illustrated in FIG. 1A, electronic apparatus 100 may include an enclosure or housing 102 in which the housing 102 may include one or more air inflow port(s) 104, one or more air outflow port(s) 106, and one or more fan(s) 108. The housing 102 may include a number of sides (e.g., left, right, front, back, top, and bottom (not labeled)). It is to be understood that the size and/or shape of housing 102 is provided for illustrative purposes only and is not meant to limit the broad scope of the present disclosure.

The one or more air inflow port(s) 104 are configured to allow air to enter/flow into housing 102 during normal operation of electronic apparatus 100 and are configured to limit internal air within the housing 102 from exiting the housing 102 during one or more corrosion inhibitor dispensing processes via one or more inflow air restriction element(s) 105 that are configured for the air inflow port(s) 104.

The one or more air outflow port(s) 106 are configured to allow air to exit/flow out of housing 102 during normal operation of electronic apparatus 100 and are configured to limit external air from entering the housing 102 during one or more corrosion inhibitor dispensing processes via one or more outflow air restriction element(s) 107 that are configured for the air outflow port(s). FIG. 1B illustrates a portion of housing 102 that includes the air outflow port(s) 106, outflow air restriction element(s) 107, and fan(s) 108 in further detail.

In various embodiments, any combination of the one or more inflow air restriction element(s) 105 and/or the outflow air restriction element(s) 107 may be implemented as any combination of active (e.g., electronically controlled) and/or passive air restriction elements, such as flaps, shutters, slides, deflectors, valves, etc. as discussed in further detail herein.

Although three air inflow ports 104 and three air outflow ports 106 are illustrated for the electronic apparatus of FIGS. 1A, 1B, and 1C, it is to be understood that any number, size, and/or configuration of air inflow and air outflow ports may be provided for an electronic apparatus in accordance with embodiments herein. In addition, the number of air inflow port(s) 104 and air outflow port(s) 106 may be the same or different. Further, any combination of filters, screens, and/or any other similar elements may be provided for air inflow ports 104 and/or air outflow ports 106 in accordance with embodiments herein.

The housing 102 for electronic apparatus 100 further includes at least one circuit board 112, including at least one heat sink 114, and electronic components 116 mounted or otherwise affixed to the circuit board 112. In various embodiments, circuit board 112 may be implemented as a printed circuit board (PCB) having one or more layer(s), a breadboard, a stripboard, combinations thereof, and/or the like.

The housing 102 for electronic apparatus 100 further includes a corrosion inhibitor dispensing system 120. FIGS. 1A and 1D illustrate various elements of corrosion inhibitor dispensing system 120, which may include a controller 121 and a dispensing reservoir or container 122 (also referred to herein as container 122). Controller 121 may be any computing device that manages one or more corrosion inhibitor dispensing processes for corrosion inhibitor dispensing system 120. In various embodiments, controller 121 may be any computing device, which may be implemented as an electronic component 116 of circuit board 112, as a modular/pluggable component that may be connected to circuit board 112, combinations thereof, and/or the like.

The dispensing container 122 may be configured to hold an amount of a corrosion inhibitor material or substance 126 (also referred to herein as corrosion inhibitor 126). The dispensing container 122 may include one or more dispensing port(s) 124 configured with one or more vapor flow restriction element(s) 125. The dispensing container 122 may further be configured with one or more temperature sensor(s) 123 and an auxiliary heat source 127 (as shown in FIG. 1D).

Although configuration of dispensing port(s) 124 illustrated for FIGS. 1A and 1C illustrate(s) the port(s) 124 as being provided for a top side of dispensing container 122, it is to be understood that the dispensing port(s) 124 may be provided in any number and/or configuration for one or more side(s) and/or the top of dispensing container 122.

The temperature sensor(s) 123 may be configured for the dispensing container 122 (internally and/or externally) in order to measure/monitor the temperature of corrosion inhibitor 126. The auxiliary heat source 127 may be configured for the dispensing container 122 in order to apply heat to the dispensing container 122 and, in turn, the corrosion inhibitor 126 to accelerate vaporization of the corrosion inhibitor 126 for one or more dispensing processes, as discussed in further detail herein. In at least one embodiment, the auxiliary heat source 127 may be a resistive heat source configured for the dispensing container 122. Other types of heat sources can be envisioned. In at least one embodiment, the auxiliary heat source 127 may be configured as multiple auxiliary heat sources.

As shown in FIG. 1D, in some embodiments, the corrosion inhibitor dispensing system 120 may further include one or more environmental sensor(s) 128, which may be placed at various locations inside and/or outside housing 102 in order to measure one or more environmental conditions internal and/or external to housing 102.

The controller 121 interfaces with temperature sensor(s) 123, auxiliary heat source 127, and fan(s) 108 of housing 102 to manage the one or more corrosion inhibitor dispensing processes in accordance with embodiments discussed herein. The controller 121 may further interface with environmental sensor(s) 128 to manage the one or more corrosion inhibitor dispensing processes for embodiments in which environmental sensor(s) 128 may be included in the corrosion inhibitor dispensing system 120. The controller 121 may further interface with vapor flow restriction element(s) 125 that may, in some embodiments, be implemented as active elements in order to control opening/closing for such active elements. The controller 121 may further interface with any combination inflow air restriction element(s) 105 that may, in some embodiments, be implemented as active elements and/or outflow air restriction element(s) 107 that may, in some embodiments, be implemented as active elements in order to control opening/closing such active elements.

In some instances, controller 121 may operate in conjunction with and/or otherwise interface with one or more other fan and/or other system controllers (not shown), etc. that may be provided for electronic apparatus 100 in order to manage operation of the fan(s) 108 for one or more corrosion inhibitor dispensing processes.

Broadly, corrosion inhibitor dispensing system 120 provides for the ability to control corrosion within housing 102 through use of corrosion inhibitor 126, which may facilitate continuous protection of the circuit board 112 and electronic components 116 while leaving the top layer of the circuit board 112 undisturbed for easy rework.

As referred to herein, the corrosion inhibitor 126 may be in the form of a non-vaporized state 126a (as shown in FIG. 1A and also referred to herein as non-vaporized corrosion inhibitor 126a) and a vaporized state 126b (as shown in FIG. 1C and also referred to herein as vaporized corrosion inhibitor 126b). For example, the corrosion inhibitor 126 is held within the container 122 in a non-vaporized state 126a and is dispensed from the container 122 within the housing 102 via one or more dispensing processes in a vaporized state 126b via dispensing port(s) 124. Vapor flow restriction element(s) 125 are configured for dispensing port(s) 124 to restrict the flow of the corrosion inhibitor 126 through dispensing port(s) 124 in the non-vaporized state 126a but allow the corrosion inhibitor 126 to flow through dispensing port(s) 124 in the vaporized state 126b. Following the one or more dispensing processes, the vaporized corrosion inhibitor 126b cools and condenses to the non-vaporized state 126a to form a coating or film on the circuit board 112 and electronic components 116 of electronic apparatus 100 to provide corrosion protection within housing 102.

In various embodiments, a non-vaporized corrosion inhibitor 126a may be provided in a liquid, gel, or solid state (or any variations thereof) within dispensing container 122. For example, a gel-like/semi-solid state for the non-vaporized corrosion inhibitor substance 126a is illustrated in FIGS. 1A and 1C. In some embodiments, a solid state corrosion inhibitor can be in a granular form, a paper/film/sheet/tab form, and/or the like. In at least one embodiment, vapor flow restriction element(s) 125 may be gas or vapor permeable membrane(s) configured for corresponding dispensing port(s) 124 that permit vaporized corrosion inhibitor 126b to be released through dispensing port(s) 124 and restrict non-vaporized corrosion inhibitor 126a from be released through dispensing port(s) 124.

In at least one embodiment, corrosion inhibitor 126 may be a volatile or vapor corrosion inhibitor (VCI) substance and/or the like. VCIs are chemical barriers that provide temporary protection from corrosive substances, such as water, contaminants, and acid gases. Generally, a VCI is a chemical substance that may be dispensed in a vaporized state/form and can condense onto the surface of an object within a space. In some embodiments, the corrosion inhibitor 126 can be tailored to the environment where the electronic apparatus 100 is deployed. For example, in various embodiments, the corrosion inhibitor 126 can be tailored to protect multiple devices and/or multiple types of materials that may be included or found in an electronic apparatuses or devices. In another example, the corrosion inhibitor 126 may be an organic and/or non-toxic VCI that is environmentally friendly.

VCIs are typically used in enclosed environments. However, embodiments herein advantageously provide for the ability to use a VCI substance in an environment that is normally ventilated but can be temporarily closed during one or more corrosion inhibitor dispensing processes through various features facilitated by corrosion inhibitor dispensing system 120.

Fan(s) 108 are configured to direct airflow for the housing for both normal operation and for one or more corrosion inhibitor dispensing processes, as discussed for various embodiments herein. In at least one embodiment, during normal operation of the electronic apparatus 100, fan(s) 108 are operated in a first (e.g., normal) operational direction 109a in order to pull air into the housing 102 through the air inflow ports 104 and push the air out of the housing 102 through air outflow ports 106, thereby facilitating an operational airflow 110a through the housing 102 for the electronic apparatus 100 to facilitate air-cooling for internal components of the electronic apparatus 100. The operational airflow 110a through the housing may also be referred to herein as a 'normal' operational airflow 110a.

Inflow air restriction element(s) 105 are configured to allow the operational airflow 110a to flow into the air inflow port(s) 104 and outflow air restriction element(s) 107 are configured to allow the operational airflow 110a to flow out of the air outflow port(s) 106 during the first operational direction 109a of fan(s) 108.

Inflow air restriction element(s) 105 are configured to restrict or limit internal air within the housing 102 from exiting the housing 102 during corrosion inhibitor dispensing processes when airflow for the housing is caused to circulate within the housing 102 via a recirculating airflow 110b, as shown in FIG. 1C. Further, outflow air restriction element(s) 107 are configured to restrict or limit external air (e.g., air on a side of the outflow air restriction element(s) 107 that is opposite a side of the outflow air restriction element(s) that faces the air outflow port(s) 106) from entering the housing 102 during the corrosion inhibitor dispensing processes when airflow for the housing is caused to circulate within the housing 102 via the recirculating airflow 110b, as shown in FIG. 1C.

Various techniques may be utilized to direct airflow for housing 102 to cause the recirculating airflow 110b within housing 102 during one or more dispensing processes. In at least one embodiment, the first (e.g., normal) operational direction 109a of fan(s) 108 can be changed from the first operational direction 109a to a second (e.g., reverse) operational direction 109b, as shown in FIG. 1C to cause the recirculating airflow within housing 102. In one at least one embodiment, one or more outflow air restriction element(s) 107 can be configured as active mechanical air deflectors that can be actuated while fan(s) 108 are operating in the first (e.g., normal) operational direction 109a such that the active mechanical air deflectors cause airflow for housing to be directed back into the housing 102, thereby facilitating the recirculating airflow 110b within housing 102 during one or more dispensing processes.

It is to be understood that the first (e.g., normal) operational direction 109a corresponding to a clockwise rotation of fan(s) 108 and the second (e.g., reverse) operational direction 109*b* corresponding to a counter-clockwise rotation of fan(s) 108 is provided for illustrative purposes only and is not meant to limit the broad scope of the present disclosure. Any configuration of clockwise/counter-clockwise rotation for normal/reverse operational directions may be utilized.

In order to prevent corrosion/provide corrosion protection for the circuit board 112 and electronic components 116 of electronic apparatus 100, controller 121 may perform one or more corrosion inhibitor dispensing processes through which the controller causes the corrosion inhibitor 126 to be heated to the vaporized state 126*b* as shown in FIG. 1C for dispensing the vaporized corrosion inhibitor 126*b* within the housing 102 in order to coat the circuit board 112 and electronic components 116 with the corrosion inhibitor 126, thereby preventing corrosion/providing corrosion protection for the elements of electronic apparatus 100.

In various embodiments, controller 121 may cause the corrosion inhibitor 126 to be heated to cause the corrosion inhibitor 126 to transition from the non-vaporized state 126*a* to the vaporized state 126*b* to facilitate dispensing the vaporized corrosion inhibitor 126*b* within housing 102 to coat the circuit board 112 and electronic components 116.

In at least one embodiment, corrosion inhibitor dispensing system 120 can be mounted to heat sink 114 such that heat from the heat sink 114 can be utilized to apply heat to the dispensing container 122 and, in turn, heat the corrosion inhibitor 126 to cause the corrosion inhibitor 126 to transition from the non-vaporized state 126*a* to the vaporized state 126*b*. In some embodiments, heating the corrosion inhibitor 126 can be accelerated by causing auxiliary heat source 127 to apply heat to dispensing container 122 to establish conditions favorable for corrosion inhibitor 126 (e.g., VCI) deposition within housing prior to dispensing through control of fans 108.

Although the location of dispensing container 122 for the embodiments of FIGS. 1A-1C is illustrated as being positioned within housing 102 near or proximate to air outflow port(s) 106, it is to be understood that dispensing container 122 can be provided at any location and/or position within housing 102 (e.g., along a side, etc.) that may be utilized to facilitate dispensing corrosion inhibitor 126 in the vaporized state 126*b* within housing 102 in accordance with embodiments herein. Additionally, although only one dispensing container 122 is illustrated for the embodiments of FIGS. 1A-1C, it is to be understood that any number of dispensing containers 122 (e.g., two, three, etc.), have a same or different shapes/configurations/etc. may be provided for an electronic apparatus in accordance with embodiments herein.

As noted above, inflow air restriction element(s) 105 and outflow air restriction element(s) 107 are configured to restrict or limit internal air within the housing 102 from exiting the housing 102 (via inflow air restriction element(s) 105) and limit external air from entering the housing (via outflow air restriction element(s) 107) during the corrosion inhibitor dispensing process. Thus, reversing the fan(s) 108 to the second (e.g., reverse) operational direction 109*b* or maintaining the fans in the first (e.g., normal) operational direction 109*a* combined with the configuration of the inflow and outflow air restriction element(s) 105/107 limiting air from entering and exiting the housing 102 may cause the recirculating airflow 110*b* be to be facilitated within the housing 102, which may accelerate deposition of the vaporized corrosion inhibitor 126*b* within housing 102 in order to provide a film or coating of the corrosion inhibitor 126 over the circuit board 112 and electronic components 116. Thus, a goal of recirculating the air is to accelerate deposition of the vaporized corrosion inhibitor 126*b*.

The corrosion inhibitor dispensing process can be performed for a period of time that can be preconfigured, based on environmental conditions, based on expected corrosion protection that is to be provided by the corrosion inhibitor 126 (e.g., number of days of expected protection), combinations thereof, and/or the like. For example, in one embodiment the period of time may be preconfigured to 100 seconds, which may provide an estimated 7 days of protection for the circuit board 112 and electronic components 116 within the housing 102 of electronic apparatus 100. Once the vaporized corrosion inhibitor 126*b* has been circulated within housing 102 for a period of time, the controller 121 causes the (normal) operational airflow 110*a* to provide air-cooling for the electronic apparatus 100 (e.g., by returning fan(s) 108 to their first (e.g., normal) operational direction 109*a*, by opening air deflector(s) configured for air outflow port(s) 106 while the fan(s) 108 are maintained in the first (e.g., normal) operational direction 109*a*, and/or any other combination of causing inflow and/or outflow air restriction element(s) 105/107 to open).

Accordingly, techniques herein advantageously provide for the use of a corrosion inhibitor, such as a VCI, in a space that is typically ventilated to provide air-cooling, as opposed to the traditional application of a VCI in non-ventilated spaces. Thus, corrosion inhibitor dispensing system 120 facilitates protection for metal and/or electronic surfaces in an open-air system/environment via one or more dispensing processes that are non-hazardous, maintenance free, and leave circuit boards re-workable.

As the corrosion inhibitor 126 (e.g., VCI) is not a permanent coating, but rather a temporary protective film, periodic re-application of the corrosion inhibitor 126 may be provided within the housing 102 of electronic apparatus 100. A capacity for the dispensing container 122 may be configured to hold an amount of corrosion inhibitor 126 that can support an expected the lifetime of the electronic apparatus 100, thus involving little or no maintenance once the electronic apparatus 100 is deployed.

To facilitate re-application of the corrosion inhibitor 126, a schedule for performing multiple dispensing processes can be configured for corrosion inhibitor dispensing system 120 via controller 121. Based on the schedule, when the controller 121 determines that a corrosion inhibitor dispensing process is to be performed, the controller 121 can cause vaporization of the corrosion inhibitor 126. As noted, the auxiliary heat source 127 can be leveraged to accelerate vaporized corrosion inhibitor 126*b* deployment based on environmental conditions in some instances. Vaporized corrosion inhibitor 126*b* can be released from the dispensing container 122 through dispensing port(s) (e.g., via vapor flow restriction element(s) 125). By changing the first (e.g., normal) operational direction 109*a* of fan(s) 108 to the second (e.g., reverse) operational direction 109*b* or by maintaining the first (e.g., normal) operational direction 109a of fan(s) 108 combined with the use of the inflow/outflow air restriction element(s) 105/107, the vaporized corrosion inhibitor 126b can be recirculated throughout the housing 102 via the recirculating airflow 110b. Once the vapor has been circulated for a dispensing time period, the controller 121 causes the (normal) operational airflow 110a to be provided for the housing 102 utilizing any techniques discussed herein until another dispensing process is determined to be performed.

In some embodiments, the schedule for one or more corrosion inhibitor dispensing processes, the dispensing time period for one or more corrosion inhibitor dispensing processes, and/or the management of one or more dispensing processes can be updated based on environmental conditions sensed for the housing 102, circuit board 112, and/or electronic components 116 in order to provide optimal corrosion inhibitor 126 deposition for electronic apparatus 100. Environmental sensor(s) 128 may be provided to measure one or more environmental conditions for electronic apparatus 100 including, but not limited to, external temperature (external to housing 102), internal temperature (internal to housing 102), internal humidity, presence and/or exposure of one or more corrosive gasses and/or other corrosive materials/substances within the housing 102, temperature for the circuit board 112, temperature of one or more electronic component(s) 116, combinations thereof, and/or the like.

For example, if the circuit board 112 environment is too hot, the controller 121 can speed up the fan(s) 108 in preparation for switching the airflow direction for the housing from the (normal) operational airflow 110a to the recirculating airflow 110b in order to protect the electronic apparatus 100 from overheating during a dispensing process. In the converse, if the environment is too cold for effective corrosion inhibitor deposition, the controller 121 may use auxiliary heat source 127 to bring the environment into a temperature range that may enable effective deposition. As the frequency of application may be dependent on the environment in which the electronic apparatus 100 is deployed, the amount of corrosion inhibitor 126 provided for the dispensing container 122 can be varied. Other updates/variations can be envisioned, as discussed for other examples described herein.

In some instances, a corrosion inhibitor dispensing process may be referred to as a 'maintenance mode' or 'maintenance cycle'; however, this is not meant to imply that the electronic apparatus 100 switches from its normal operation in order to dispense the corrosion inhibitor 126 within housing 102. Electronic apparatus 100 can continue normal operations during corrosion inhibitor dispensing processes.

In various embodiments, the corrosion inhibitor dispensing system 120 can be configured as a modulated or modular component that can configured with a small footprint to facilitate integration into any sizes of electronic apparatuses and/or any sizes of heat sinks. Although FIGS. 1A and 1C illustrate that corrosion inhibitor dispensing system 120 can be mounted to a heat sink, such as heat sink 114, in some embodiments the corrosion inhibitor dispensing system may not be mounted to a heat sink.

Advantageously, the corrosion inhibitor dispensing system 120 can be configured to utilize any existing fan(s) 108 that may be provided to facilitate air-cooling for electronic apparatus 100 to also be used to facilitate recirculating vaporized corrosion inhibitor 126b for corrosion inhibitor dispensing processes.

Although there are many VCIs that are non-hazardous to humans, some VCIs may be hazardous to human inhalation and/or skin irritation. In some embodiments, the maintenance cycle for deposition processes can be monitored to limit potential human exposure for any VCI that may exit an electronic apparatus during a dispensing process. In some embodiments, a VCI may be utilized for corrosion inhibitor dispensing system 120 that is compatible with materials internal to the components within the housing 102 of electronic apparatus 100 and that is also compatible with any equipment that may surround the electronic apparatus 100 such that the equipment may not experience adverse impacts from potential vaporized VCI particle exposure. However, as discussed herein, inflow air restriction element(s) 105 and outflow air restriction element(s) are provided to limit internal air, and potentially VCI, from exiting electronic apparatus 100 during dispensing processes.

In various embodiments, any combination of inflow air restriction element(s) 105 and/or outflow air restriction element(s) 107 may be configured as any combination of active and/or passive air flaps/shutters/etc., active airflow deflectors, active and/or passive single or unidirectional direction airflow valves, single or unidirectional diaphragms, combinations thereof, and/or the like. For embodiments in which one or more inflow/outflow air restriction element(s) 105/107 are active elements, controller 121 manages opening and closing the element(s) for one or more corrosion inhibitor dispensing processes via corresponding electronically controlled opening/closing mechanisms.

In various embodiments, vapor flow restriction element(s) 125 restriction element(s) may be configured as any combination of a gas or vapor permeable membrane, active and/or passive air flaps/shutters/etc., active vapor deflectors, active and/or passive single or unidirectional direction airflow valves, single or unidirectional diaphragms, combinations thereof, and/or the like. For embodiments in which one or more vapor flow restriction element(s) 125 are active element(s), the controller 121 manages opening and closing the element(s) for one or more corrosion inhibitor dispensing processes via corresponding electronically controlled opening/closing mechanisms.

FIGS. 2A, 2B, 2C, and 2D are diagrammatic representations depicting different example air and/or vapor restriction element configurations that may be utilized for an electronic apparatus that includes a corrosion inhibitor dispensing system, according to various example embodiments.

Referring to FIG. 2A, FIG. 2A is a diagrammatic representation depicting an example inflow air restriction element configuration that may be utilized for an electronic apparatus that includes a corrosion inhibitor dispensing system, according to an example embodiment. FIG. 2A illustrates a portion of a housing 202 including an air inflow port 204 in which an active or passive shutter mechanism 205 can be configured as the inflow air restriction element for the air inflow port 204. The active or passive shutter mechanism 205 includes a number of active or passive shutter elements 205.1, 205.2, and 205.3 that can be affixed, mounted, etc. to the air inflow port 204 via one or more hinges or the like that may enable opening and closing the shutter elements 205.1, 205.2, and 205.3.

During normal operation of an electronic apparatus, the active or passive shutter elements 205.1, 205.2, and 205.3 can be opened to facilitate a normal operational airflow direction that allows air to flow into housing 202 (e.g., operational airflow 110a as shown in FIG. 1A). The active or passive shutter elements 205.1, 205.2, and 205.3 can be closed during a corrosion inhibitor dispensing process to restrict or limit internal air and a vaporized corrosion inhibitor within the housing 202 from exiting the housing 202, thereby facilitating a recirculating airflow within the housing 202 (e.g., recirculating airflow 110b as shown in FIG. 1C).

For implementations in which the shutter elements 205.1, 205.2, and 205.3 of shutter mechanism 205 are passive shutter elements, the force of air being blown from fans on an opposing end of the housing 202 operating in a reverse operational direction can facilitate closing the shutter elements to restrict or limit internal air/vaporized corrosion inhibitor within the housing 202 from exiting the housing 202. The passive shutter elements can re-open following a corrosion inhibitor dispensing process as air is pulled into the housing 202 via the normal operational direction of the fans.

For implementations in which the shutter elements 205.1, 205.2, and 205.3 of shutter mechanism 205 are active shutter elements, a controller of the corrosion inhibitor dispensing system (e.g., controller 121) can control the opening and closing of the active shutter elements via one or more control mechanisms. In various embodiments, one or more control mechanisms may include electronically controlled actuators, levers, arms, combinations thereof, and/or the like.

Referring to FIG. 2B, FIG. 2B is a diagrammatic representation depicting an example outflow air restriction element configuration that may be utilized for an electronic apparatus that includes a corrosion inhibitor dispensing system, according to an example embodiment. FIG. 2B illustrates a portion of the housing 202 including an air outflow port 206 in which an active or passive flap mechanism 207 can be configured as the outflow air restriction element for the air outflow port 206. Also shown in FIG. 2B is a fan 208 that may be mounted on or in the air outflow port 206. The active or passive flap mechanism includes a flap element 207 that can be affixed, mounted, etc. to the air outflow port 206 via one or more hinges or the like that may enable opening and closing the flap element.

During normal operation of an electronic apparatus, the active or passive flap element of the flap mechanism 207 can be opened to facilitate a normal operational airflow direction that allows air to flow out of housing 202 (e.g., operational airflow 110a as shown in FIG. 1A). The active or passive flap element can be closed during a corrosion inhibitor dispensing process to restrict or limit internal air and a vaporized corrosion inhibitor within the housing 202 from flowing out of the housing 202 and also to restrict or limit external air from entering the housing 202, thereby facilitating a recirculating airflow within the housing 202 (e.g., recirculating airflow 110b as shown in FIG. 1C).

For implementations in which the flap element of the flap mechanism 205 is a passive flap element, the force of air being blown from fan 208 in a reverse operational direction can facilitate closing the flap element (e.g., the suction of air into the fan 208 pulls the flap element closed) to restrict or limit internal air/vaporized corrosion inhibitor within the housing 202 from exiting the housing 202 and also to limit external air from entering the housing 202. The passive flap element can re-open following a corrosion inhibitor dispensing process as air is pulled into the housing 202 and pushed out of the housing 202 via the normal operational direction of the fan 208.

For implementations in which the flap element of flap mechanism 207 is an active flap element, a controller of the corrosion inhibitor dispensing system (e.g., controller 121) can control the opening and closing of the active flap element via one or more control mechanisms. In various embodiments, one or more control mechanisms may include electronically controlled actuators, levers, arms, combinations thereof, and/or the like.

Although three shutter elements are illustrated for the embodiment of FIG. 2A, it is to be understood that any number of shutter elements may be utilized for a shutter mechanism in accordance with embodiments herein. It is further to be understood example configurations illustrated for FIGS. 2A and 2B are only provided to illustrate example details that may be associated with air inflow and outflow ports that may be configured for an enclosure or housing of an electronic apparatus. Virtually any configuration and/or combination of shutter mechanisms, flap mechanisms, and/or any other airflow restriction elements (inflow and/or outflow) may be configured for any combination of air inflow ports and/or air outflow ports for an enclosure or housing of an electronic apparatus in accordance with embodiments herein.

Figure 2C:
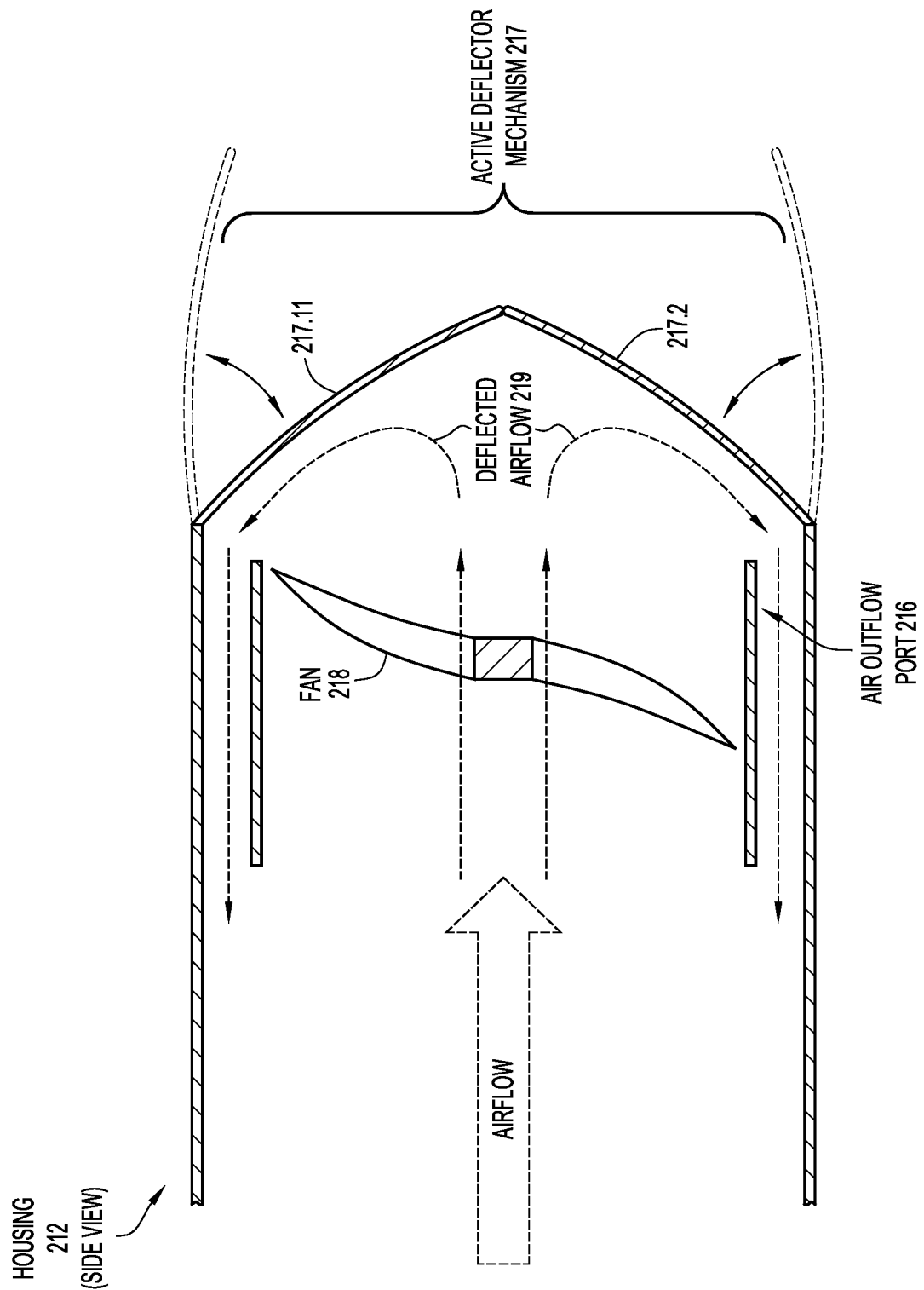

Referring to FIG. 2C, FIG. 2C is a diagrammatic representation depicting another example outflow air restriction element configuration that may be utilized for an electronic apparatus that includes a corrosion inhibitor dispensing system, according to an example embodiment. FIG. 2C illustrates a side view portion of a housing 212 including an air outflow port 216 in which an active deflector mechanism 217 can be configured as the outflow air restriction element for the air outflow port 216. Also shown in FIG. 2C is a fan 218 that may be mounted on or in the air outflow port 216. In one embodiment, the active deflector mechanism 217 can include a first deflector portion 217.1 and a second deflector portion 217.2 that can be configured via one or more hinges, actuators, or the like that may enable opening and closing the first deflector portion 217.1 and the second deflector portion 217.2.

During normal operation of an electronic apparatus, the active deflector mechanism 217 can be opened to facilitate a normal operational airflow direction that allows air to flow out of housing 212 (e.g., operational airflow 110a as shown in FIG. 1A). The active deflector mechanism 217 can be closed and the normal operational direction of the fan 218 can be maintained in the normal operational direction (e.g., not reversed) during a corrosion inhibitor dispensing process.

Closing the active deflector mechanism 217 may provide for deflecting air and vaporized corrosion inhibitor (that is pulled through the air outflow port 216 via fan 218) back into housing 212 to facilitate a recirculating airflow within housing 212 (e.g., recirculating airflow 110b as shown in FIG. 1B) during a corrosion inhibitor dispensing process. Closing the active deflector mechanism 217 may also provide for limiting external air (e.g., air on a side of the active deflector mechanism 217 that is not being deflected back into the housing 212) from entering the housing 212.

An example direction of deflected air/vaporized corrosion inhibitor 219 for the embodiment of FIG. 2C is generally illustrated by the dashed-line arrows shown FIG. 2C, which illustrates active deflector mechanism 217, including the first deflector portion 217.1 and the second deflector portion 217.2, being controlled to be in a closed state. The deflected air/vaporized corrosion inhibitor 219 may contribute to a recirculating airflow within the housing 212 (e.g., air/vaporized corrosion inhibitor is pulled into the fan from within the housing and then deflected back into the housing via active deflector mechanism 217). When controlled to be in an open state (shown in dashed lines in FIG. 2C), it is to be understood that the active deflector mechanism 217, including the first deflector portion 217.1 and the second deflector portion 217.2 can be controlled (e.g., opened) to allow air to flow out of housing 212 (e.g., not deflected back into the housing 212).

It is to be understood that the example active deflector mechanism/deflector portions illustrated for the embodiment of FIG. 2C are provided for illustrative purposes only and are not meant to limit the broad scope of the present disclosure. In various embodiment, active deflector mechanisms/deflector portions can be provided in any size, shape, number of deflector portions, etc. in order to facilitate deflecting air/vaporized corrosion inhibitor back into a housing. In some embodiments, for example, active deflector portions can be curved to improve airflow/deflection. However, in some embodiments, active deflector portions can be straight and/or may have a combination of straight/curved portions. Thus, in some instances, active flap(s), shutter(s), etc. configured for air outflow port(s) may be considered active air deflector mechanisms. In various embodiments, one or more control mechanisms provided for active air deflector mechanisms can include electronically controlled actuators, levers, arms, combinations thereof, and/or the like.

In some embodiments one or more seals, gaskets, etc. may be configured for any combination of an air inflow and/or outflow ports and/or air restriction elements that may be configured for the ports. Virtually any mechanisms and/or combination of mechanisms that may provide for the ability to limit internal air and/or vaporized corrosion inhibitor from exiting an enclosure or housing of an electronic apparatus or that may improve deflecting air and/or directing air in a recirculating direction (e.g., utilizing baffles, plenums, etc.) during a corrosion inhibitor dispensing process may be utilized in accordance with embodiments herein.

Figure 2D:
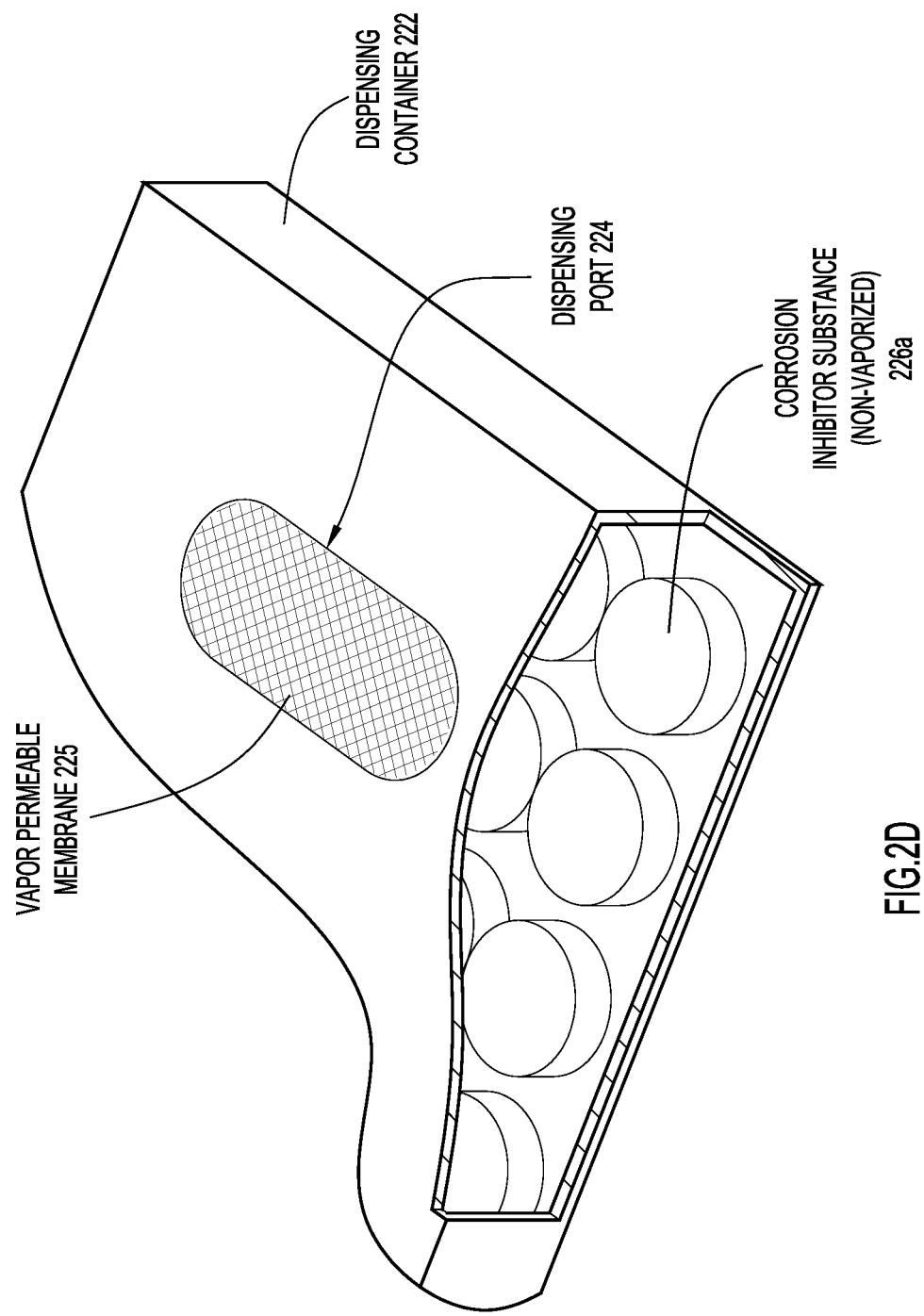

Referring to FIG. 2D, FIG. 2D is a diagrammatic representation depicting an example vapor restriction element configuration that may be utilized for an dispensing container of a corrosion inhibitor dispensing system, according to an example embodiment. In particular, FIG. 2C illustrates a portion of a dispensing container 222 including a dispensing port 224 in which a gas or vapor permeable membrane 225 can be configured as the vapor flow restriction element for the dispensing port 224 that permits a vaporized corrosion inhibitor (not shown in FIG. 2D) to be released through dispensing port 224 for a dispensing process restricts non-vaporized corrosion inhibitor from be released through dispensing port 224 during normal operation of an electronic apparatus. A non-vaporized corrosion inhibitor substance 226a is illustrated in FIG. 2D. For the embodiment of FIG. 2D, the non-vaporized corrosion inhibitor substance 226a. For the embodiment of FIG. 2D, the non-vaporized corrosion inhibitor substance 226a is illustrated in a solid state as a number of VCI tabs or similar elements within dispensing container 222.

Figure 3:
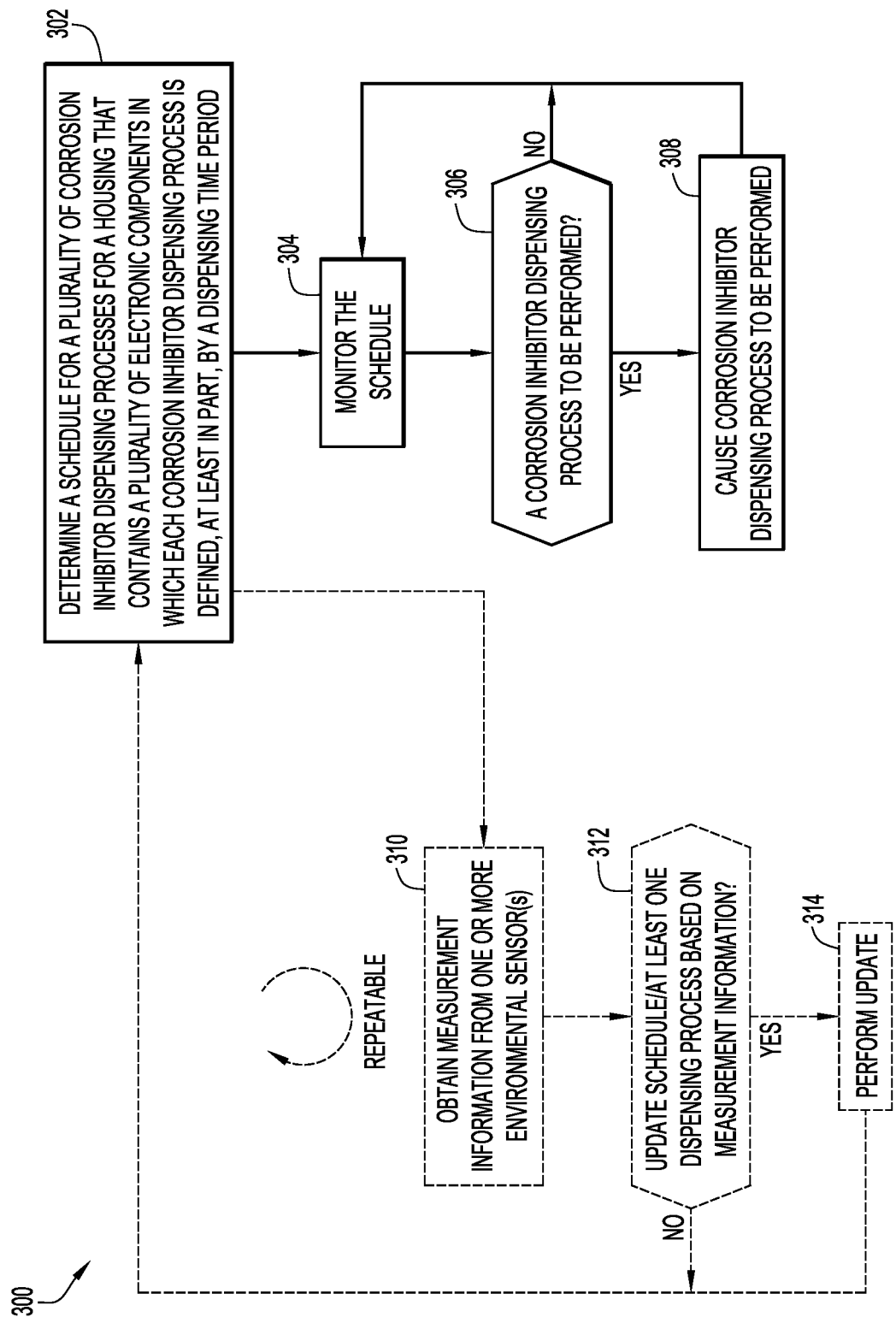
FIG. 3 is a flow chart depicting a method according to an example embodiment.

Referring to FIG. 3, FIG. 3 is a flow chart depicting a method 300 according to an example embodiment. In particular, method 300 illustrates example operations that may be performed by a controller of a corrosion inhibitor dispensing system to facilitate dispensing a corrosion inhibitor within a housing of an electronic apparatus based on a dispensing schedule, according to an example embodiment. For example, method 300 may be performed by controller 121 of corrosion inhibitor dispensing system 120 to facilitate dispensing corrosion inhibitor 126 within housing 102 of electronic apparatus 100 based on a schedule configured for controller 121.

At 302, the method may include determining, by the controller (e.g., via control logic, etc.) a schedule for a plurality of corrosion inhibitor dispensing processes for a housing that contains a plurality of electronic components in which each corrosion inhibitor dispensing process is defined, at least in part, by a dispensing time period. In some embodiments, the schedule can be predefined for the controller (e.g., stored within one or more memory elements, storage, etc.). In some embodiments, the schedule can be loaded and/or updated for the controller following deployment of the electronic apparatus that contains the corrosion inhibitor dispensing system.

In various embodiments, the schedule for the dispensing processes can identify a total number of dispensing processes that are to be performed throughout the lifetime of the electronic apparatus, minimum and/or maximum maintenance cycle periods (e.g., minimum and/or maximum number of days between dispensing processes), specific days for which dispensing processes are to be performed, times of days at which dispensing processes are to be performed, events that may trigger a dispensing process (e.g., reaching the end of a maximum maintenance cycle period), combinations thereof, and/or the like.

One or more parameters can be configured for the corrosion inhibitor dispensing processes including, but not limited to, the dispensing time period and a threshold dispensing temperature to which the dispensing container is to be heated to vaporize the corrosion inhibitor. In some embodiments, the threshold dispensing temperature may be configured as a temperature range that may enable effective corrosion inhibitor deposition within the housing of the electronic apparatus. In various embodiments, the threshold temperature/temperature range may be configured to maintain a balance between temperature and vapor pressure within the housing. Thus, a range of threshold temperatures/temperature ranges can be envisioned.

In some embodiments, the one or more parameters can include fan speed and/or directional information indicating different speeds and/or directions at which one or more fans for the electronic apparatus can be operated. In still some embodiments, the one or more parameters can include temperature information indicating, for example, normal operating temperature/temperature range for the circuit board and/or internal housing temperature for the electronic apparatus, maximum operating temperature/temperature range for the circuit board(s)/electronic component(s), and/or internal housing temperature for the electronic apparatus, combinations thereof, and/or the like.

At 304, the method includes the controller monitoring the schedule in order to determine, as shown at 306, whether a corrosion dispensing process is to be performed. Based on a determining that a corrosion dispensing process is to be performed (YES at 306), the controller causes the corrosion inhibitor dispensing process to be performed based on the schedule, as shown at 308 and, upon completion of the dispensing process, the method returns to 304 at which the controller continues to monitor the schedule to determine whether another corrosion dispensing process is to be performed. Referring again to 306, the controller continues to monitor (304) the schedule in the event that no deposition process is determined (NO at 306).

In some embodiments, the schedule and/or one or more dispensing process(es) may be updated based on one or more environmental conditions that may be determined for the electronic apparatus. For example, environmental condition parameters can be configured for the controller that may be utilized by the controller to trigger updates to at least one of the schedule and/or or one or more corrosion inhibitor dispensing process(es). In various embodiments, environmental condition parameters may identify any combination of humidity conditions/thresholds/ranges, internal temperature thresholds/ranges, external temperature thresholds/ranges, circuit board/component temperature thresholds/ranges, presence and/or exposure of certain corrosive gasses/materials/substances, and/or the like that may trigger updates to at least one of the schedule and/or one or more dispensing processes.

In some embodiments, threshold time period(s) (e.g., hours, days, etc.) may be configured in combination with various humidity, temperature, and/or corrosive gas/material/substance exposures/conditions/thresholds/ranges, which may be used to trigger an update for instances in which certain environmental conditions breach or satisfy the threshold time periods (e.g., internal temperature is greater than 'X' degrees for more than 3 days, etc.)

Thus, as shown at 310, in at least one embodiment, the method may include the controller obtaining measurement information from one or more environmental sensors configured for the corrosion inhibitor dispensing system (e.g., environmental sensor(s) 128).

At 312, the controller may determine whether to update at least one of the schedule and/or at least one corrosion inhibitor dispensing process based on the measurement information. Based on determining that at least one of the schedule and/or at least one corrosion inhibitor dispensing process is to be updated (YES at 312), the controller performs the update, as shown at 314, and the method returns to 302 and 304 at which the schedule is monitored for performing a deposition process. However, if no update is determined (NO at 312), the method returns to 302 and 304 at which the schedule is monitored for performing a deposition process.

Consider an example in which at least one environmental sensor is a humidity sensor and/or a corrosive gasses/substances/material sensor configured for the electronic apparatus. In this example, the controller may obtain measurement information from the humidity sensor and/or the corrosive gasses/substances/material sensor (e.g., at 310) that indicates an increased humidity that breaches or satisfies a humidity threshold parameter (e.g., humidity above a threshold for a particular day, above a threshold for multiple days, etc.) and/or indicates an amount of a corrosive gas/substances/material that satisfies threshold, indicates a presence of a particular type of corrosive gas/substance/material, etc. (e.g., for a particular day, for a multiple days, etc.) configured for the controller, which triggers the controller (e.g., at 312) to update the schedule (e.g., at 314) in order to perform the next dispensing process before its regularly scheduled day/time. Based on the update, the controller can determine, based on monitoring the schedule at 304, when the next dispensing process is to be performed.

Although this example involves updating the day/time for performing a dispensing process, other updates may include, but not be limited to, updating the dispensing time period for a dispensing process (e.g., increasing or decreasing the dispensing time period), updating fan speed control for one or more dispensing processes, updating threshold dispensing temperatures/temperature ranges for one or more dispensing processes, and/or the like.

In various embodiments, the operations at 310, 312, and 314 (if applicable) can be repeated on a periodic basis, on a continuous basis, as triggered by one or more environmental conditions, as triggered by a human operator monitoring the corrosion inhibitor dispensing system, combinations thereof, and/or the like.

Figure 4:
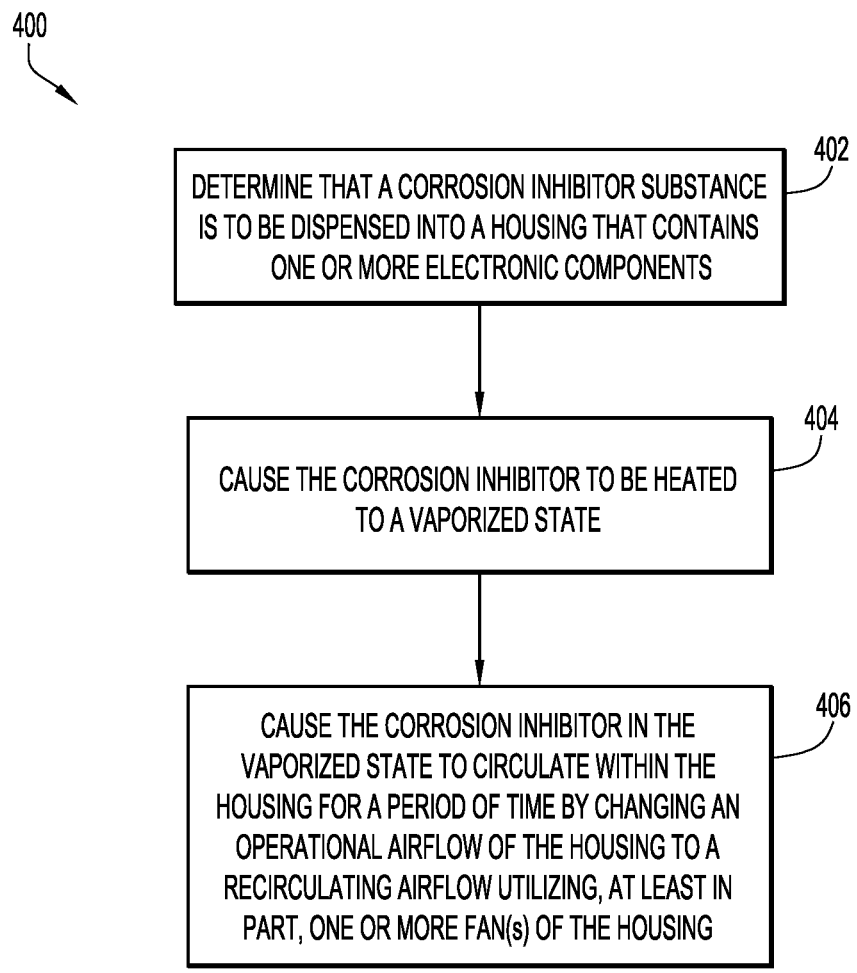
FIG. 4 is another flow chart depicting another method according to an example embodiment.

Referring to FIG. 4, FIG. 4 is another flow chart depicting another method 400 according to an example embodiment. In particular, method 400 illustrates example operations that may be performed by a controller of a corrosion inhibitor dispensing system to perform a corrosion inhibitor dispensing process to dispense a vaporized corrosion inhibitor substance within a housing that contains a plurality of electronic components, according to an example embodiment. Thus, method 400 may represent a corrosion inhibitor dispensing process, according to an example embodiment. In at least one embodiment, method 400 may be performed by controller 121 of corrosion inhibitor dispensing system 120 to perform a corrosion inhibitor dispensing process to dispense corrosion inhibitor 126 within housing 102 of electronic apparatus 100 containing circuit board 112 and electronic components 116.

At 402, the method includes the controller determining that a corrosion inhibitor substance is to be dispensed into a housing that contains one or more electronic components. In at least one embodiment, the controller can determine that the corrosion inhibitor substance is to be dispensed into the housing based on a schedule configured for the controller that identifies at least one corrosion inhibitor dispensing process that is to be performed by the controller for a given time/day. The controller further determines a time period for dispensing the corrosion inhibitor substance. In some instances, the schedule and the time period for dispensing the corrosion inhibitor substance can be based on measurement information obtained from one or more environmental sensor(s) (e.g., environmental sensor(s) 128) that are configured to measure one or more of an external temperature, an internal temperature within the housing, an internal humidity in the housing, a presence and/or exposure of one or more corrosive gasses/materials/substances within the housing, a temperature of one or more circuit board(s) of the housing, and/or a temperature of one or more electronic component(s) within the housing.

At 404, the method includes the controller causing the corrosion inhibitor substance to be heated to a vaporized state. At 406, the method includes the controller causing the corrosion inhibitor substance in the vaporized state to circulate within the housing for a period of time by changing an operational airflow of the housing to a recirculating airflow utilizing, at least in part, one or more fans (e.g., fan(s) 108) for the housing.

For example, at least one embodiment, the operational airflow of the housing may be changed from the normal operational airflow through the housing to a recirculating airflow within the housing by changing a first (e.g., normal) operational direction (rotation) of one or more fan(s) of the housing to a second (e.g., reverse) operational direction and causing inflow air restriction element(s) for one or more air inflow port(s) and outflow air restriction element(s) for one or more air outflow port(s) to be closed (e.g., actively or passively closed).

In another example, the operational airflow of the housing may be changed from the normal operational airflow through the housing to a recirculating airflow within the housing by maintaining a first (e.g., normal) operational direction (rotation) of one or more fan(s) of the housing, causing inflow air restriction element(s) for one or more air inflow port(s) to be closed (e.g., actively or passively closed), and causing outflow air restriction element(s) configured as active deflector mechanisms for one or more air outflow port(s) to be closed.

In various embodiments, causing the corrosion inhibitor substance to be heated to the vaporized state may include at least one of causing a heat source to apply heat to a container (e.g., turning on auxiliary heat source 127 for dispensing container 122) that contains the corrosion inhibitor substance in a non-vaporized state prior to changing the operational airflow for the housing to be the recirculating airflow for a dispensing process.

Although only one corrosion inhibitor dispensing process is illustrated for the embodiment of FIG. 4, it is to be understood that the operations may be repeated for additional dispensing processes in accordance with embodiments described herein.

Figure 5:
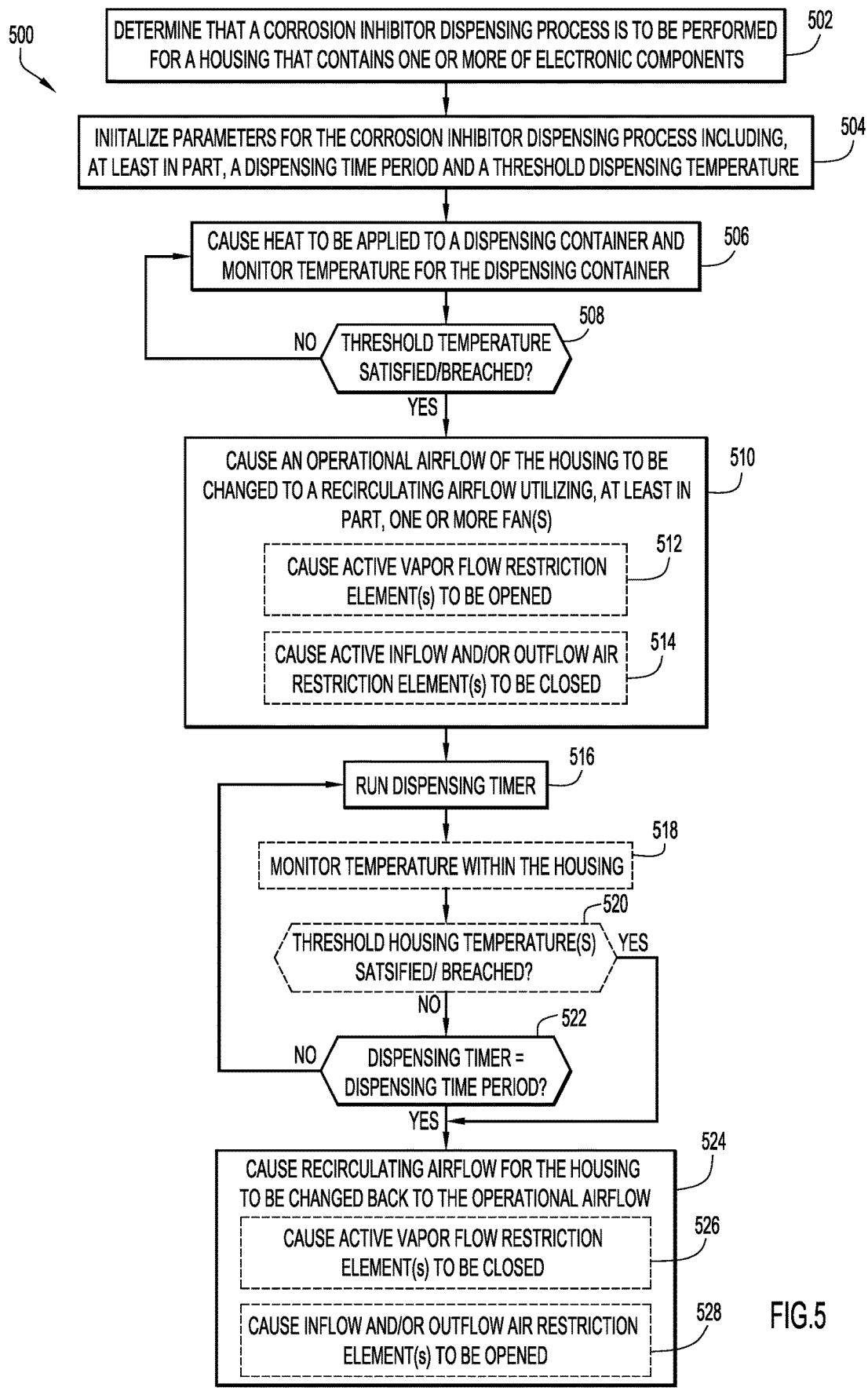
FIG. 5 is yet another flow chart depicting yet another method according to an example embodiment.

Referring to FIG. 5, FIG. 5 is yet another flow chart depicting yet another method 500 according to an example embodiment. In particular, method 500 illustrates example operations that may be performed by a controller of a corrosion inhibitor dispensing system to perform a corrosion inhibitor dispensing process to dispense a vaporized corrosion inhibitor substance within a housing that contains a plurality of electronic components, according to an example embodiment. Thus, method 500 may represent a corrosion inhibitor dispensing process, according to an example embodiment. In at least one embodiment, method 500 may be performed by controller 121 of corrosion inhibitor dispensing system 120 to perform a corrosion inhibitor dispensing process to dispense corrosion inhibitor 126 within housing 102 of electronic apparatus 100 containing circuit board 112 and electronic components 116.

At 502, the method includes the controller determining that a corrosion inhibitor dispensing process is to be performed for a housing that contains one or more electronic components. In various embodiments, the determining at 502 can be performed based on a schedule configured for the controller that identifies at least one corrosion inhibitor dispensing process that is to be performed by the controller for a given time/day (e.g., as discussed above at least at 402 of FIG. 4).

At 504, the method includes the controller initializing parameters for the corrosion inhibitor dispensing process including, at least in part, a dispensing time period and a threshold dispensing temperature. The dispensing time period may indicate a period of time (e.g., in seconds) for which vaporized corrosion inhibitor is to be recirculated within the housing. The threshold dispensing temperature may indicate a threshold temperature or temperature range to which the dispensing container is to be heated to cause the corrosion inhibitor substance to vaporize.

At 506, the method includes the controller to cause heat to be applied to the dispensing container and the controller monitors the temperature for the dispensing container in order to determine, at 508, whether the threshold temperature or temperature range is satisfied or breached (e.g., container temperature≥threshold temperature, minimum threshold temperature≤container temperature≥maximum threshold temperature, or any variations thereof).

In some embodiments, the threshold temperature/temperature range may be set to heat the container to a temperature/temperature range that facilitates vaporization of the corrosion inhibitor throughout the dispensing process such that, based on the dispensing time period, the temperature for the corrosion inhibitor may fall below the vaporization temperature during and/or upon completion of the dispensing time period to condense and coat internal electronic components of the electronic apparatus. Other variations for controlling the temperature of the dispensing container and vaporization of the corrosion inhibitor can be envisioned, as discussed for various example embodiments, below.

The controller can monitor the heat for the dispensing container via temperature sensor(s) (e.g., temperature sensor(s) 123) configured for the dispensing container. In various embodiments, causing the corrosion inhibitor substance to be heated to the vaporized state may include at least one of causing a heat source to apply heat to a container (e.g., turning on auxiliary heat source 127 for dispensing container 122) that contains the corrosion inhibitor substance in a non-vaporized state prior to changing the normal operational airflow of the housing to be the recirculating airflow for a dispensing process.

Upon the controller determining that the threshold temperature/temperature range is not satisfied or breached (NO at 508), the controller continues to cause heat to be applied to the dispensing container and monitors the heat, as shown at 506. Upon determining that the threshold temperature/temperature range is satisfied or breached (YES at 508), the method includes the controller, at 510, causing an operational airflow of the housing (e.g., normal airflow direction through the housing) to be changed to a recirculating airflow within the housing utilizing, at least in part, one or more fan(s) of the housing (e.g., fan(s) 108)) and running/monitoring a dispensing timer at 516 and 522 (e.g., the controller starts the dispensing timer from 0 and counts up until the dispensing timer is equal to the dispensing time period).

In some embodiments, the controller may cause heat to not be applied to the dispensing container during once the threshold temperature/temperature range is satisfied (e.g., the controller 121 may turn off auxiliary heat source 127). However, in some embodiments, the controller may continue to control the auxiliary heat source to cause heat to be applied the dispensing container throughout a dispensing process in order to maintain the threshold temperature/temperature range for the dispensing container throughout the dispensing process.

In at least one embodiment, causing the operational airflow of the housing to be changed to the recirculating airflow may include changing a first (e.g., normal) operational direction (rotation) of one or more fan(s) of the housing to a second (e.g., reverse) operational direction and causing inflow air restriction element(s) for one or more air inflow port(s) and outflow air restriction element(s) for one or more air outflow port(s) to be closed (e.g., actively or passively closed). For example, causing the first (e.g., normal) operational direction for the one or more fan(s) to be changed to the second (e.g., reverse) operational direction in combination with closing inflow and outflow air restriction elements configured for air inflow and outflow ports of the housing (e.g., inflow/outflow air restriction element(s) 105/107 configured for corresponding air inflow/outflow ports 104/106) can limit internal air/vaporized corrosion inhibitor within the housing from exiting the housing and cause the air/vaporized corrosion inhibitor within the housing to recirculate for the dispensing time period.

In another embodiment, causing the operational airflow of the housing to be changed to the recirculating airflow may include maintaining a first (e.g., normal) operational direction (rotation) of one or more fan(s) of the housing, causing inflow air restriction element(s) for one or more air inflow port(s) to be closed (e.g., actively or passively closed), and causing outflow air restriction element(s) configured as active deflector mechanisms for one or more air outflow port(s) to be closed. For example, causing the first (e.g., normal) operational direction for the one or more fan(s) to be maintained in the first direction (rotation) in combination with closing inflow air restriction elements configured for the air inflow ports and closing outflow air restriction elements configured as active deflector mechanisms for air outflow ports of the housing can deflect air/vaporized corrosion inhibitor pulled through the outflow air ports back into the housing, thereby causing the air/vaporized corrosion inhibitor within the housing to recirculate for the dispensing time period.

For embodiments, in which passive vapor flow restriction element(s) are provided for dispensing port(s) of the dispensing container, such as a gas/vapor permeable membrane, the membrane allows the vaporized corrosion inhibitor to flow through the dispensing ports for the dispensing time period.

In some embodiments, if active vapor flow restriction element(s) (e.g., active flap(s), shutter(s), slide(s), deflector(s), etc.) are configured for the dispensing container, the operations at 510 may include the controller causing the active vapor flow restriction element(s) to be opened, as shown at 512, in order to allow the vaporized corrosion inhibitor to flow through the dispensing ports for the dispensing time period.

For embodiments, in which passive inflow/outflow air restriction element(s) are configured for the housing, causing the first (e.g., normal) operational direction of the fan(s) for the housing to be reversed to the second operational direction can cause the passive inflow/outflow air restriction element(s) to close in order to cause the air and vaporized corrosion inhibitor to be recirculated within the housing via the recirculating airflow for the dispensing time period.

In some embodiments, if active inflow and/or outflow air restriction element(s) (e.g., active flaps, shutters, deflector mechanisms, etc.) are configured for the housing, the operations at 510 may include the controller causing the active inflow and/or outflow air restriction elements to be closed, as shown at 514, in order to cause the air and vaporized corrosion inhibitor to be recirculated within the housing for the dispensing time period.

As shown at 516 and 522, the controller continues to run the dispensing timer (NO at 522) until the dispensing timer is equal to the dispensing time period. Upon determining that the dispensing timer is equal to the dispensing time period (YES at 522), the controller causes the recirculating airflow for the housing to be changed back to the operational airflow for the housing (e.g., normal airflow through the housing), as shown at 524, and the dispensing process may be considered complete.

In some embodiments, the controller, via one or more environmental sensor(s) may monitor, as shown at 518, the temperature within the housing, which may include monitoring the internal temperature for any combination of the internal temperature of the housing, one or more circuit board(s) within the housing, and/or one or more electronic component(s) for the electronic apparatus (e.g., at least one environmental sensor 128 implemented as an internal temperature sensor for the housing and/or as a temperature sensor for one or more circuit board(s)/electronic components to monitor for a maximum/critical operating temperature/temperature range, etc.). In combination with 518, as shown at 520, the controller may determine whether one or more threshold housing temperature(s) are satisfied or breached. If no threshold housing temperature(s) are satisfied or breached (NO at 520), the dispensing timer running/monitoring at 516/522 may continue. However, if one or more threshold housing temperature(s) are satisfied or breached (YES at 520), the controller may determine that the dispensing process is to be completed before the dispensing timer is equal to the dispensing time period, thereby causing the recirculating airflow of the housing to be changed back the operational airflow as shown at 524, as well as performing any other any other optional operations, as discussed for various embodiments herein.

In some embodiments, if the controller has continued to cause heat to be applied to the dispensing container during the dispensing process, the controller can cause heat to not be applied to the dispensing container upon determining that the dispensing timer is equal to the dispensing time period (YES at 522). In some embodiments, the controller may cause heat to not be applied to the dispensing container at some delta offset from which the dispensing period is expected to end (e.g., to allow the temperature for the corrosion inhibitor to fall below the vaporizing temperature of the corrosion inhibitor before changing the operational direction of the fan(s) from the second (e.g., reverse) operational direction back to the first (e.g. normal) operational direction).

For embodiments, in which passive vapor flow restriction element(s) are provided for dispensing port(s) of the dispensing container, such as a gas/vapor permeable membrane, the membrane restricts non-vaporized corrosion inhibitor from flowing through the dispensing ports upon completion of the dispensing time period. In some embodiments, if active vapor flow restriction element(s) (e.g., active flap(s), shutter(s), slide(s), deflector(s), etc.) are configured for the dispensing container, the operations at 524 involving changing the recirculating airflow back to the (normal) operational airflow may include the controller causing the active vapor flow restriction element(s) to be closed, as shown at 526, in order to restrict vaporized and/or non-vaporized corrosion inhibitor from flowing through the dispensing ports upon completion of the dispensing time period.

For embodiments, in which passive inflow/outflow air restriction element(s) are configured for the housing, causing the recirculating airflow within the housing to return to the (normal) operational airflow (through the housing) may be performed by changing the operational direction of the fan(s) from the second (e.g., reverse) operational direction back to the first (e.g., normal) operational direction (rotation), thereby causing the passive inflow/outflow air restriction element(s) to re-open in order to facilitate the (normal) operational airflow through the housing via the air inflow/outflow ports to provide air-cooling for the electronic apparatus. In some embodiments, if active inflow and/or outflow air restriction element(s) are configured for the housing, the operations at 524 involving changing the recirculating airflow back to the operational airflow may include the controller causing the active inflow and/or outflow air restriction elements to be opened, as shown at 528, in order to facilitate the operational airflow through the housing via the air inflow/outflow ports upon completion of the dispensing time period.

Although only one corrosion inhibitor dispensing process is illustrated for the embodiment of FIG. 5, it is to be understood that the operations may be repeated for additional dispensing processes in accordance with embodiments described herein.

Figure 6:
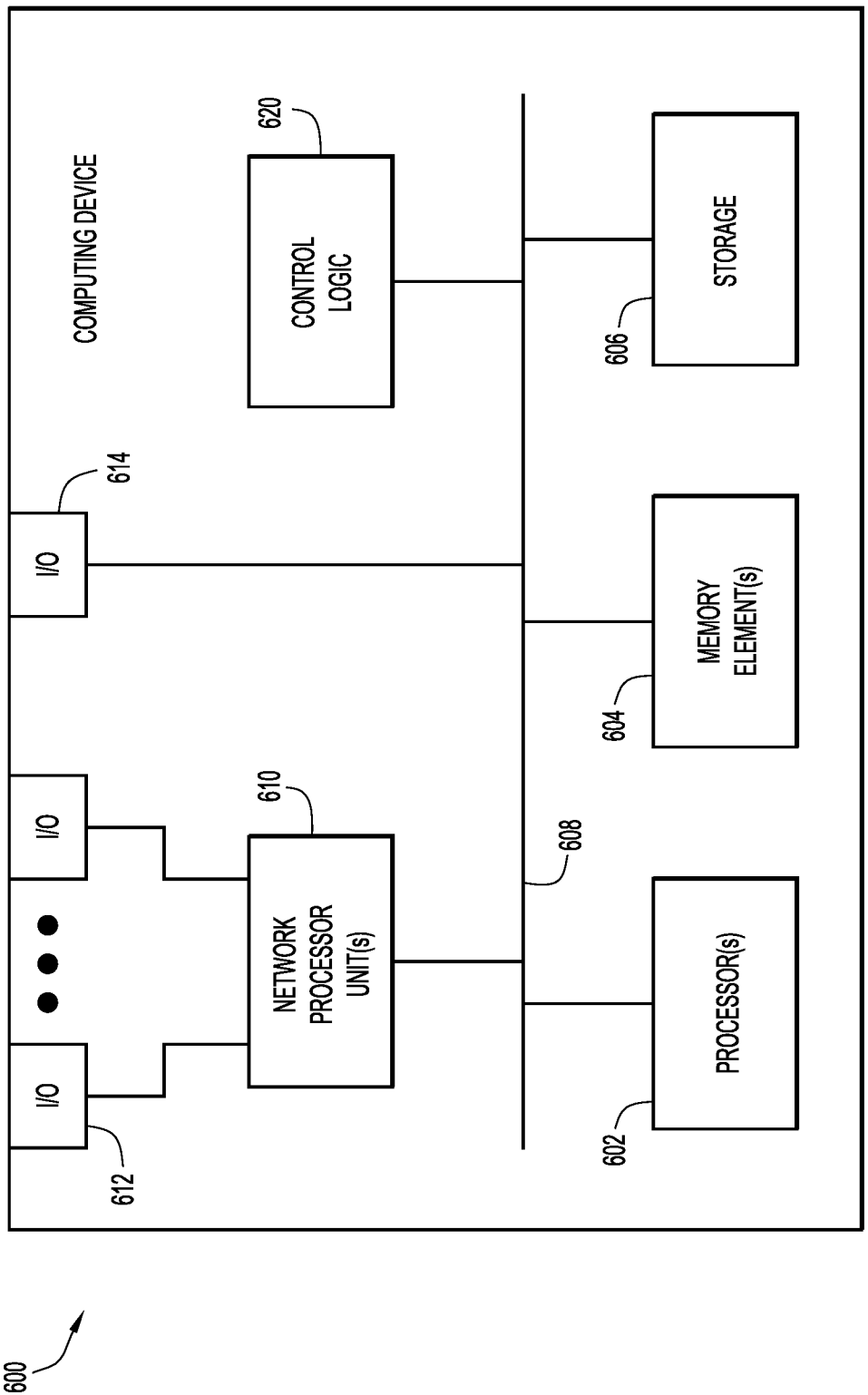
FIG. 6 is a hardware block diagram of a computing device that may perform functions associated with any combination of operations discussed herein.

Referring to FIG. 6, FIG. 6 illustrates a hardware block diagram of a computing device 600 that may perform functions associated with any operations discussed herein. In various embodiments, a computing device, such as computing device 600 or any combination of computing devices 600, may be configured as any entity/entities as discussed herein in order to perform operations of the various techniques discussed herein, such as, for example, operations that may be performed by controller 121 of corrosion inhibitor dispensing system 120 to perform one or more corrosion inhibitor dispensing processes.

In at least one embodiment, computing device 600 may include one or more processor(s) 602, one or more memory element(s) 604, storage 606, a bus 608, one or more network processor unit(s) 610 interconnected with one or more network input/output (I/O) interface(s) 612, one or more I/O interface(s) 614, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations and/or functions for computing device 600 as described herein according to software and/or instructions configured for computing device. Processor(s) 602 (e.g., hardware processor(s)) can execute any type of instructions associated with data to achieve the operations detailed herein. In one example, processor(s) 602 can transform an element or an article (e.g., data, information) from one state or thing to another state or thing. Any potential processors, microprocessors, digital signal processor, baseband signal processor, modem, PHY, controllers, systems, managers, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory element(s) 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, network processor unit(s) 610 may enable communication between computing device 600 and other systems, entities, etc., via network I/O interface(s) 612 (wired and/or wireless) to facilitate operations discussed for various embodiments described herein. In various embodiments, network processor unit(s) 610 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s) and/or other similar network interface driver(s) and/or controller(s) now known or hereafter developed to enable communications between computing device 600 and other systems, entities, etc. to facilitate operations for various embodiments described herein. In various embodiments, network I/O interface(s) 612 can be configured as one or more Ethernet port(s), Fibre Channel ports, any other I/O port(s), and/or antenna(s)/antenna array(s) now known or hereafter developed. Thus, the network processor unit(s) 610 and/or network I/O interface(s) 612 may include suitable interfaces for receiving, transmitting, and/or otherwise communicating data and/or information in a network environment.

I/O interface(s) 614 allow for input and output of data and/or information (wired or wireless) with other entities that may be connected to computing device 600. For example, I/O interface(s) 614 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 620 can include instructions that, when executed, cause processor(s) 602 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

For example, in at least one implementation, control logic 620 can include instructions that, when executed, cause processor(s) 602 to perform operations including, but not limited to determining that a corrosion inhibitor substance is to be dispensed into a housing that contains one or more electronic components; causing the corrosion inhibitor substance to be heated to a vaporized state; and causing the corrosion inhibitor substance in the vaporized state to circulate within the housing for a period of time by changing an operational airflow of the housing to a recirculating airflow utilizing, at least in part, one or more fans for the housing.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, and register, list, cache, storage, and/or storage structure: all of which can be referenced at any suitable time frame. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory element(s) 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In summary, provided herein is a corrosion inhibitor dispensing system that provides for the in-situ application of a corrosion inhibitor, such as a VCI for an electronic apparatus in order to protect internal elements of the apparatus from corrosion.

Various advantages may be realized utilizing the corrosion inhibitor dispensing system described herein. For example, in one embodiment, the system may be developed and implemented for an electronic apparatus for less than the cost of providing a traditional conformal coating, with the added benefit of being able to re-work electronic components of the apparatus. Beyond cost, there are many benefits to using a VCI over coating economically. For example, conformal coating typically cannot be applied in a layer thicker than 6 millimeters (mm), which can result in uneven coverage on boards with varying component heights. In contrast, the techniques provided by the corrosion inhibitor dispensing system described herein advantageously provides for corrosion inhibitor (e.g., VCI) distribution in which the corrosion inhibitor can mold to the landscape of the circuit board or boards of an electronic apparatus. Moreover, the corrosion inhibitor may not inhibit airflow or convection over the surface of a circuit board or boards of an electronic apparatus.

Further, the corrosion inhibitor may not interfere with re-work of electronic devices within an apparatus for instances in which re-work of a circuit board/boards, electronic components, devices, etc. is to be performed for an electronic apparatus. This is especially advantageous as more, potentially expensive, boards are deployed in undesirable environments.

Additionally, conformal coating is a hazardous material, while there are many non-hazardous corrosion inhibitors/VCIs that may be utilized by the corrosion inhibitor dispensing system discussed for embodiments herein. In some embodiments, the system could monitor one or more of air quality, humidity, presence of corrosive gasses/substances/materials, etc. to collect interactive data, finding which environments are most harmful to different circuit boards/electronic components. In some embodiments, monitoring could additionally be used to predict/determine if one or more element(s) of an electronic apparatus may be corroded prior to failure.

Accordingly, the corrosion inhibitor dispensing system described herein is a proactive response to the changing environmental challenges that electronic products are facing. As companies become more energy-conscious, products will likely encounter environments that are not humidity or air-quality controlled. A corrosion prevention system as discussed for embodiments herein that follows/remains with an electronic apparatus, is maintenance free, and does not render the apparatus irreparable is relevant both now and for the future.

In one form, an apparatus is provided that includes a housing configured to contain one or more electronic components; one or more air inflow ports for the housing, wherein the one or more air inflow ports are configured to limit internal air within the housing from exiting the housing during one or more corrosion inhibitor dispensing processes; one or more air outflow ports for the housing, wherein the one or more air outflow ports are configured to limit external air from entering the housing during the one or more corrosion inhibitor dispensing processes; one or more fans configured for the one or more air outflow ports to direct air for the housing; and a corrosion inhibitor dispensing system, the corrosion inhibitor dispensing system comprising: a dispensing container to hold a corrosion inhibitor substance in a non-vaporized state, wherein the dispensing container comprises one or more ports for dispensing the corrosion inhibitor substance in a vaporized state during the one or more corrosion inhibitor dispensing processes; and a controller to manage the one or more corrosion inhibitor dispensing processes.

In one instance, the corrosion inhibitor dispensing system further comprises a heat source to apply heat to the dispensing container for at least one corrosion inhibitor dispensing process of the one or more corrosion inhibitor dispensing processes. In one instance, the dispensing container is mounted to a heat sink for a circuit board contained within the housing. In one instance, the one or more ports of the dispensing container comprise a vapor permeable membrane.

In one instance, the corrosion inhibitor substance is a volatile corrosion inhibitor (VCI) substance.

In one instance, the one or more air inflow ports are configured with inflow air restriction elements to limit internal air within the housing from exiting the housing during the one or more corrosion inhibitor dispensing processes and the one or more air outflow ports are configured with outflow air restriction elements to limit external air from entering the housing during the one or more corrosion inhibitor dispensing processes. In various instances, the inflow air restriction elements and the outflow air restriction elements comprise one or more of: unidirectional airflow valves; passive airflow shutters; passive airflow flaps; active mechanical airflow shutters that are controlled, at least in part, by the controller; active mechanical airflow flaps that are controlled, at least in part, by the controller; and active mechanical airflow deflectors that are controlled, at least in part, by the controller.

In one instance, the corrosion inhibitor dispensing system further comprises one or more environmental sensors to measure one or more of an external temperature for the apparatus; an internal temperature for the apparatus; an internal humidity for the apparatus; and an internal corrosive material exposure for the apparatus. In one instance, the controller obtains measurement information from the one or more environmental sensors to manage at least one of a schedule for a plurality of corrosion inhibitor dispensing processes and a dispensing time period for at least one corrosion inhibitor dispensing process.

In one instance, to control the one or more corrosion inhibitor dispensing processes includes one of changing a first operational direction for the one or more fans to a second operational direction to cause the corrosion inhibitor substance in the vaporized state to circulate within the housing for a period of time; and maintaining a first operational direction of the one or more fans and closing one or more outflow air restriction elements of the one or more air outflow ports to cause the corrosion inhibitor substance in the vaporized state to circulate within the housing for a period of time. In one instance, to control the one or more corrosion inhibitor dispensing processes further includes heating the dispensing container via at least one heat source to cause the corrosion inhibitor substance to transition from a non-vaporized state to the vaporized state.

In one form, a corrosion inhibitor dispensing system for a housing that is to contain one or more electronic components is provided that includes a dispensing container to hold a corrosion inhibitor substance in a non-vaporized state, wherein the dispensing container comprises one or more ports for dispensing the corrosion inhibitor substance in a vaporized state; and a controller to manage one or more corrosion inhibitor dispensing processes, wherein the one or more corrosion inhibitor dispensing processes include causing the corrosion inhibitor substance in the vaporized state to circulate within the housing for a period of time by changing an operational airflow of the housing to a recirculating airflow utilizing, at least in part, one or more fans of the housing.

In one instance, the corrosion inhibitor dispensing system may further include a heat source configured to apply heat to the dispensing container for at least one corrosion inhibitor dispensing process. In one instance, the dispensing container may be mounted to a heat sink of a circuit board contained in the housing. In one instance, the one or more ports of the dispensing container may include a vapor permeable membrane.

In one instance, the corrosion inhibitor dispensing system may further include one or more environmental sensors configured to measure one or more of an external temperature; an internal temperature in the housing; an internal humidity in the housing; and an internal corrosive material exposure in the housing.

In one form, a method is provided that may include determining that a corrosion inhibitor substance is to be dispensed into a housing that contains one or more electronic components; causing the corrosion inhibitor substance to be heated to a vaporized state; and causing the corrosion inhibitor substance in the vaporized state to circulate within the housing for a period of time by changing an operational airflow of the housing to a recirculating airflow utilizing, at least in part, one or more fans for the housing.

In at least one instance, causing the corrosion inhibitor substance to be heated to the vaporized state includes causing a heat source to apply heat to a container that contains the corrosion inhibitor substance in a non-vaporized state.

In one instance, the method may include determining at least one of: a schedule for dispensing the corrosion inhibitor substance, wherein the schedule indicates at least one of one or more days and one or more times at which the corrosion inhibitor substance is to be dispensed; and a time period for dispensing the corrosion inhibitor substance. In one instance, determining at least one of the schedule for dispensing the corrosion inhibitor substance and the time period for dispensing the corrosion inhibitor substance is based on measurement information obtained from one or more environmental sensors that are configured to measure one or more of: an external temperature; an internal temperature in the housing; an internal humidity in the housing, and internal corrosive material exposure for the housing.

In one form, one or more non-transitory computer readable storage media encoded with instructions that, when executed by a processor, cause the processor to perform operations, comprising: determining that a corrosion inhibitor substance is to be dispensed into a housing that contains one or more electronic components; causing the corrosion inhibitor substance to be heated to a vaporized state; and causing the corrosion inhibitor substance in the vaporized state to circulate within the housing for a period of time by changing an operational airflow of the housing to a recirculating airflow utilizing, at least in part, one or more fans of the housing.

In one form, an apparatus is provided that includes at least one memory element for storing data; and at least one processor for executing instructions associated with the data, wherein executing the instructions causes the system to perform operations, comprising: determining that a corrosion inhibitor substance is to be dispensed into a housing that contains one or more electronic components; causing the corrosion inhibitor substance to be heated to a vaporized state; and causing the corrosion inhibitor substance in the vaporized state to circulate within the housing for a period of time by changing an operational airflow of the housing to a recirculating airflow utilizing, at least in part, one or more fans of the housing.

Variations and Implementations

In various example implementations, an electronic apparatus for various embodiments described herein can encompass network elements (which can include virtualized network elements, functions, etc.) such as, for example, network appliances, forwarders, routers, servers, switches, gateways, bridges, load balancers, firewalls, processors, modules, radio receivers/transmitters, and/or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a system can be referred to herein as 'messages', 'messaging', 'signaling', 'data', 'content', 'objects', 'requests', 'queries', 'responses', 'replies', etc. which may be inclusive of packets.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a housing configured to contain one or more electronic components;
    one or more air inflow ports for the housing, wherein the one or more air inflow ports are configured to limit internal air within the housing from exiting the housing during one or more corrosion inhibitor dispensing processes;
    one or more air outflow ports for the housing, wherein the one or more air outflow ports are configured to limit external air from entering the housing during the one or more corrosion inhibitor dispensing processes;
    one or more fans configured for the one or more air outflow ports to direct airflow for the housing; and
    a corrosion inhibitor dispensing system, the corrosion inhibitor dispensing system comprising:
        a dispensing container to hold a corrosion inhibitor substance in a non-vaporized state, wherein the dispensing container comprises one or more ports for dispensing the corrosion inhibitor substance in a vaporized state during the one or more corrosion inhibitor dispensing processes; and
        a controller to manage the one or more corrosion inhibitor dispensing processes.

2. The apparatus of claim 1, wherein the corrosion inhibitor dispensing system further comprises a heat source to apply heat to the dispensing container for at least one corrosion inhibitor dispensing process of the one or more corrosion inhibitor dispensing processes.

3. The apparatus of claim 1, wherein the dispensing container is mounted to a heat sink for a circuit board contained within the housing.

4. The apparatus of claim 1, wherein the one or more ports of the dispensing container comprise a vapor permeable membrane.

5. The apparatus of claim 1, wherein the corrosion inhibitor substance is a volatile corrosion inhibitor (VCI) substance.

6. The apparatus of claim 1, wherein the one or more air inflow ports are configured with inflow air restriction elements to limit internal air within the housing from exiting the housing during the one or more corrosion inhibitor dispensing processes and the one or more air outflow ports are configured with outflow air restriction elements to limit external air from entering the housing during the one or more corrosion inhibitor dispensing processes.

7. The apparatus of claim 6, wherein the inflow air restriction elements and the outflow air restriction elements comprise one or more of:
    unidirectional airflow valves;
    passive airflow shutters;
    passive airflow flaps;
    active mechanical airflow shutters that are controlled, at least in part, by the controller;
    active mechanical airflow flaps that are controlled, at least in part, by the controller; and
    active mechanical airflow deflectors that are controlled, at least in part, by the controller.

8. The apparatus of claim 1, wherein the corrosion inhibitor dispensing system further comprises one or more environmental sensors to measure one or more of:
an external temperature for the apparatus;
an internal temperature for the apparatus;
an internal humidity for the apparatus; and
an internal corrosive material exposure for the apparatus.

9. The apparatus of claim 8, wherein the controller is to obtain measurement information from the one or more environmental sensors to manage at least one of:
a schedule for a plurality of corrosion inhibitor dispensing processes; or
a dispensing time period for at least one corrosion inhibitor dispensing process.

10. The apparatus of claim 1, wherein to manage the one or more corrosion inhibitor dispensing processes includes one of:
changing a first operational direction of the one or more fans to a second operational direction to cause the corrosion inhibitor substance in the vaporized state to circulate within the housing for a period of time; and
maintaining a first operational direction of the one or more fans and closing one or more outflow air restriction elements of the one or more air outflow ports to cause the corrosion inhibitor substance in the vaporized state to circulate within the housing for a period of time.

11. The apparatus of claim 10, wherein to manage the one or more corrosion inhibitor dispensing processes further includes heating the dispensing container via at least one heat source to cause the corrosion inhibitor substance to transition from a non-vaporized state to the vaporized state.

12. A corrosion inhibitor dispensing system for a housing that is to contain one or more electronic components, comprising:
a dispensing container to hold a corrosion inhibitor substance in a non-vaporized state, wherein the dispensing container comprises one or more ports for dispensing the corrosion inhibitor substance in a vaporized state; and
a controller to manage one or more corrosion inhibitor dispensing processes, wherein the one or more corrosion inhibitor dispensing processes include causing the corrosion inhibitor substance in the vaporized state to circulate within the housing for a period of time by changing an operational airflow of the housing to a recirculating airflow utilizing, at least in part, one or more fans of the housing.

13. The corrosion inhibitor dispensing system of claim 12, further comprising a heat source configured to apply heat to the dispensing container for at least one corrosion inhibitor dispensing process.

14. The corrosion inhibitor dispensing system of claim 12, wherein the dispensing container is mounted to a heat sink of a circuit board contained in the housing.

15. The corrosion inhibitor dispensing system of claim 12, wherein the one or more ports of the dispensing container comprise a vapor permeable membrane.

16. The corrosion inhibitor dispensing system of claim 12, further comprising one or more environmental sensors configured to measure one or more of:
an external temperature;
an internal temperature in the housing;
an internal humidity in the housing; and
an internal corrosive material exposure in the housing.

17. The corrosion inhibitor dispensing system of claim 16, wherein the controller is to obtain measurement information from the one or more environmental sensors to manage at least one of:
a schedule for a plurality of corrosion inhibitor dispensing processes; or
a dispensing time period for at least one corrosion inhibitor dispensing process.

18. The corrosion inhibitor dispensing system of claim 12, wherein to manage the one or more corrosion inhibitor dispensing processes includes one of:
changing a first operational direction of the one or more fans of the housing to a second operational direction to change the operational airflow of the housing to the recirculating airflow;
or
maintaining a first operational direction of the one or more fans and closing one or more outflow air restriction elements of one or more air outflow ports of the housing to change the operational airflow of the housing to the recirculating airflow.

19. The corrosion inhibitor dispensing system of claim 18, wherein to manage the one or more corrosion inhibitor dispensing processes further includes heating the dispensing container via at least one heat source to cause the corrosion inhibitor substance to transition from a non-vaporized state to the vaporized state.

20. The corrosion inhibitor dispensing system of claim 12, wherein the corrosion inhibitor substance is a volatile corrosion inhibitor (VCI) substance.

* * * * *